(12) United States Patent
Baumann et al.

(10) Patent No.: US 8,228,106 B2
(45) Date of Patent: Jul. 24, 2012

(54) ON-CHIP SELF CALIBRATING DELAY MONITORING CIRCUITRY

(75) Inventors: Thomas Baumann, Anzing (DE);
Christian Pacha, Munich (DE);
Stephan Henzler, Munich (DE); Peter Huber, Neubiberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/696,731

(22) Filed: Jan. 29, 2010

(65) Prior Publication Data

US 2011/0187433 A1 Aug. 4, 2011

(51) Int. Cl.
*H03H 11/26* (2006.01)
(52) U.S. Cl. ....................................... 327/278
(58) Field of Classification Search .................. 327/276, 327/158
See application file for complete search history.

(56) References Cited

U.S. PATENT DOCUMENTS 6,993,109 B2* 1/2006 Lee et al. ....................... 375/376

OTHER PUBLICATIONS

Blaauw et al., "RazorII Error Detection and Correction for PVT and SER tolerance", IEEE International Solid-State Circuits Conference, 2008, 27 Pages.
Bowman et al., "Energy-Efficient and Metastability-Immune Resilient Circuits for Dynamic Variation Tolerance", IEEE Journal of Solid-State Circuits, vol. 44, No. 1, Jan. 2009, pp. 49-63.
Das, "RazorII: In Situ Error Detection and Correction for PVT and SER Tolerance", IEEE Journal of Solid-State Circuits, vol. 44., No. 1, Jan. 2009, pp. 32-48.
Drake, et al., "A Distributed Critical-Path Timing Monitor for a 65nm High-Performance Microprocessor" IBM, Austin, TX, ISSCC 2007, 2 pages.
Drake, et al., "Dynamic Measurement of Critical-Path Timing", IBM Research, 2007, 4 pages.
Fischer et al., "A 90-nm Variable Frequency Clock System for a Power-Managed Itanium Architecture Processor", IEEE Journal of Solid-State Circuits, vol. 41, No., 1, Jan. 2006, pp. 218-228.
Nomura et al., "Delay and Power Monitoring Schemes for Minimizing Power Consumption by Means of Supply and Threshold Voltage Control in Active and Standby Modes", IEEE Journal of Solid-State Circuits, vol. 41, No. 4, Apr. 2006, pp. 805-814.
Restle et al., "Timing Uncertainty Measurements on the Power5 Microprocessor", IEEE International Solid-State Circuits Conference, 2004, 8 Pages.
Restle et al., "Timing Uncertainty Measurements on the Power5 Microprocessor", IBM Research, Yorktown Heights, NY, 22 Pages.
Staszewski et al., "1.3 V 20 ps Time-to-Digital Converter for Frequency Synthesis in 90-nm CMOS", IEEE Transactions on Circuits and Systems II: Express Briefs, vol. 53, No. 3, Mar. 2006, pp. 220-224.

* cited by examiner

*Primary Examiner* — Lincoln Donovan
*Assistant Examiner* — Daniel Rojas
(74) *Attorney, Agent, or Firm* — Eschweiler & Associates, LLC

(57) ABSTRACT

The present disclosure relates to on-chip self calibrating delay monitoring circuitry.

10 Claims, 12 Drawing Sheets

ON-CHIP SELF CALIBRATING DELAY MONITORING CIRCUITRY

BACKGROUND

Information about integrated circuit path delay may be utilized to specify proper supply voltage settings to conserve energy, while still providing sufficient supply voltage to meet performance requirements. As the size of metal oxide semiconductor (MOS) transistors decreases, delay of the integrated circuit paths and clock frequencies have become more sensitive to transient variations in supply voltage and temperature. The decrease in size of MOS transistors has also led to a decrease in supply voltages provided to the integrated circuits. For example, for a 32/28 nm complementary metal oxide semiconductor (CMOS) technology node, the supply voltage, $V_{DD}$, may be about 1V and for a 22/20 nm CMOS technology node, $V_{DD}$ may be about 0.9V. The supply voltage of integrated circuits is typically provided by a supply voltage regulator, which can be integrated on the same die as the integrated circuits or on a separate die.

The supply voltage required by an integrated circuit may change due to on/off cycles of subsystems of a computing device, clock frequency changes, and workload changes, such as changes in the applications executed using the integrated circuit. These types of supply voltage changes are intended to optimize power dissipation of integrated circuits. The intended change of the supply voltage, which is usually initiated by the operating system executed on the integrated circuit, is known as dynamic voltage scaling or adaptive voltage scaling. The supply voltage changes initiated by the operating system may optimize the energy dissipation of the integrated circuit by adapting the clock frequency to the actual, time-varying performance requirement of a specific application.

Supply voltage changes may also be caused by total transient current variations of the integrated circuit. These unintended total current variations may be referred to as IR-drop, since the total current variation is translated into a total variation of the on-die power supply voltage. To illustrate, the supply voltage variation, $\Delta V$, is approximately given by the product of the total variation of the current, $\Delta I$, and the total resistance of the sum of all wires connecting the power supply voltage regulator to the power supply pins of the integrated circuit, $R_{SUM}$. The supply voltage changes due to the total transient current variations may be up to 20% of the nominal, specified supply voltage.

As the supply voltage for integrated circuits decreases, the delay sensitivity to variations in supply voltage increases. For example, unintended changes in the supply voltage required by an integrated circuit may occur faster than a supply voltage regulator can adapt the supply voltage to the changes. In other words the transient response of the supply voltage regulator may be slower than the time scale of an on-chip IR drop event. Thus, the supply voltage required by the integrated circuit may not be readily available causing a delay in the execution of processes by the integrated circuit. In addition, uncertainty in measuring the delay of integrated circuit paths may be introduced because the supply voltage regulator is not able to keep up with the changes in the supply voltage required by the integrated circuit.

Uncertainty in measuring delay of integrated circuit paths may result in difficulty determining whether the status of a chip is critical (e.g. that a timing violation is occurring or is imminent). A timing violation may be defined as a status where the delay of a speed critical path of an integrated circuit exceeds the clock period of the integrated circuit. A timing violation can lead to a temporal or permanent malfunction of the integrated circuit.

In a particular example, the delay of a speed critical path of pipelined integrated circuits comprising clock controlled flip-flops or registers separated by combinational logic having about 10-50 CMOS logic stages, may have several components. To illustrate, the delay of a speed critical path of a pipelined integrated circuit may include the clock to output delay of a first data launching flip flop, the delay of the combinational logic, a setup time of a second data launching flip flop, and a timing margin to cover non-idealities in clock distribution, such as clock skew and jitter. Any spatial and/or temporal variation of these timing parameters of the pipelined integrated circuit may produce a timing violation. In this disclosure, clock skew may include a spatial variation of the arrival time of the clock edge at different flip-flops due to imbalances in the clock distribution circuitry and clock jitter may include a transient variation of the arrival time of the clock edge at different flip flops.

Timing violations in integrated circuits may be also generated by unintended temperature variations. These temperature variations may be caused by heating of the silicon substrate due to the power dissipation of the integrated circuit. Temperature variations may also be produced by placing additional power dissipating integrated circuits on the same printed circuit board as a particular integrated circuit or placing the additional power dissipating integrated circuits and the particular integrated circuit within one package, such that the heat generated by the additional power dissipating integrated circuits diffuses to the particular integrated circuit and increases the temperature. Temperature variations may occur on a much slower time scale than unintended voltage variations. For example, temperature variations vary between several millisecond and seconds, whereas unintended supply voltage variations occur between 100 picoseconds and about 10 milliseconds.

In CMOS technologies, both the temperature and the supply voltage variation may alter the speed of the MOS transistors. For example, at supply voltages above 1.1V in a 32/28 nm CMOS technology, increasing temperatures reduce the drive current of MOS transistors and hence reduce the speed of the CMOS circuits. In another example, at supply voltages below 0.9V in a 32/28 nm CMOS technology, increasing temperature increases the drive current of MOS transistors and hence increases the speed of the CMOS circuits. The interactions of temperature and supply voltage variations are a priori not fully known during the design phase of CMOS circuit design. Therefore, safety margins may be added to the target circuit speed. In addition, to provide error free or substantially error free functionality of integrated circuits for a large number of possible temperature and supply voltage states, simulations assuming distinct supply voltage and temperature operating points may be performed during the design phase.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1:
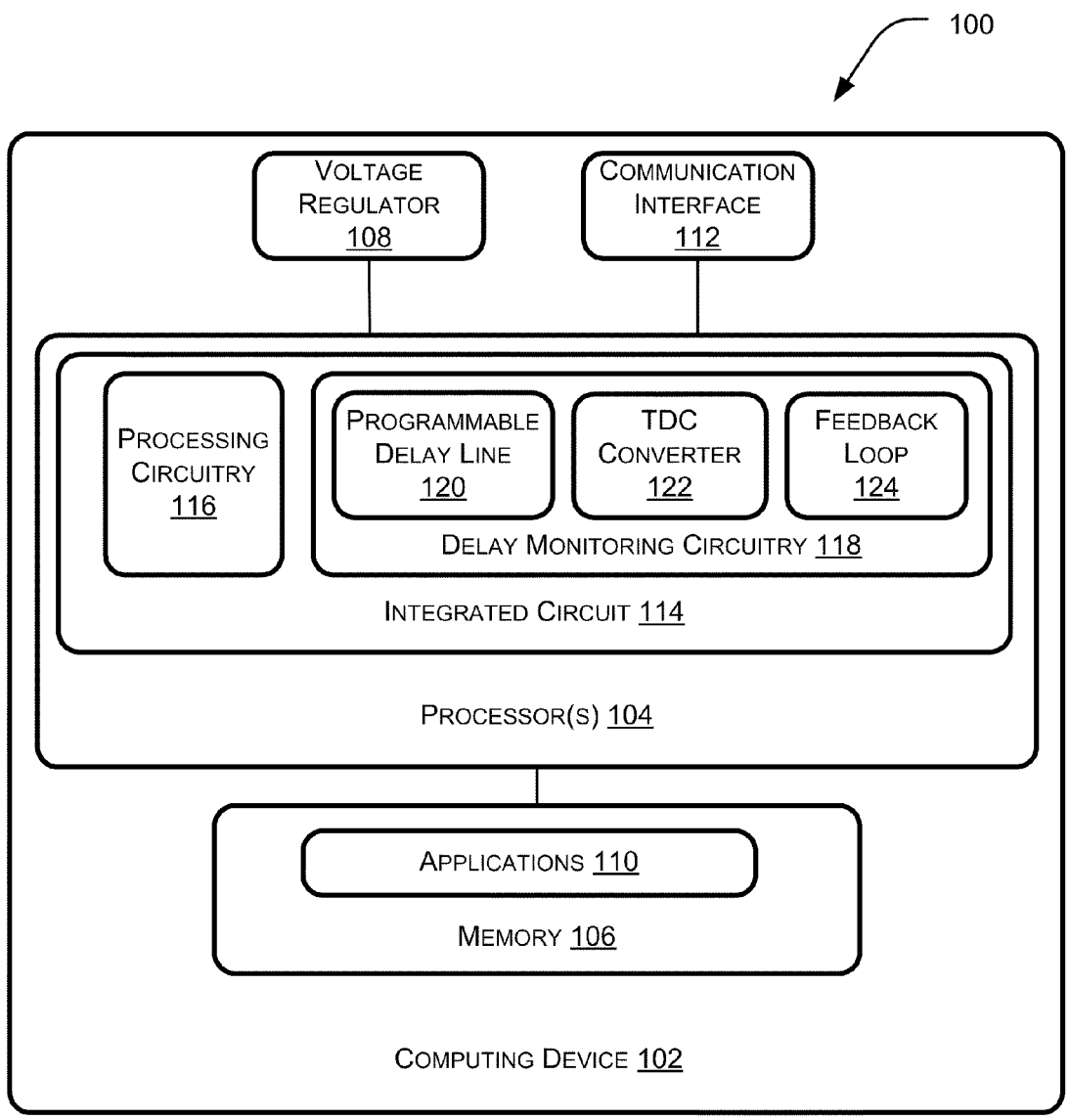
FIG. 1 is a schematic diagram of a system including a computing device having an integrated circuit with delay monitoring circuitry.

Delay monitoring circuitry may be utilized to minimize or avoid timing violations caused by changes to the supply voltage required by an integrated circuit and/or caused by temperature variations of the integrated circuit by estimating the delay of paths of the integrated circuit under certain conditions. The paths of the integrated circuit may include a data launching master slave flip-flop connected to some combinational logic that is connected to a data receiving master slave flip-flop. The master slave flip flops may include clocked storage elements that change state only at one or both clock edges.

In some instances, the delay monitoring circuitry may be integrated into one or more critical paths of the integrated circuit. This delay monitoring circuitry may be referred to in this disclosure as "in situ" delay monitoring circuitry. In situ delay monitoring circuitry may require a larger number of flip-flops, such as 20,000-50,000, to replace a master slave flip-flop arrangement of the path being monitored. Thus, in situ delay monitoring flip-flops consume a larger area of the integrated circuit than the master slave flip-flop arrangement. In addition, a critical path being monitored may not always be active when data is gathered to estimate the delay of the path. Consequently, the accuracy of estimates for the delay of the path may be diminished.

Delay monitoring circuitry may also be located off-chip. For example, during testing of an integrated circuit, configuration settings for the integrated circuit may be determined based on test conditions. To illustrate, configuration settings regarding clock operation and supply voltage regulation may be saved in a configuration register of the integrated circuit for a number of supply voltage and clock frequency values evaluated during testing of the chip. In addition, the configuration settings may be determined based on operating variations of the integrated circuit that may occur while the chip is utilized in a particular product. The margin for these configuration settings is often large, since the actual response of the integrated circuit during operation in a product is unknown. Further, after the integrated circuit is placed into a computing device, the computing device may run test signals during a built-in self test (BIST) to measure the delay of paths of the integrated circuit and adjust clock operation and supply voltage based on the measured delays and the configuration settings. However, the BIST is not performed concurrently with respect to normal operation of the integrated circuit and configuration settings identified during the BIST may not correspond to conditions during actual use of the integrated circuit.

This disclosure describes on-chip self calibrating delay monitoring circuitry. The delay monitoring circuitry may include a replica circuit located on-chip that estimates a delay of one or more paths of the integrated circuit. In a particular embodiment, an apparatus includes an integrated circuit having processing circuitry to execute one or more processes of the integrated circuit and delay monitoring circuitry to estimate a delay of at least one path of the processing circuitry. The delay monitoring circuitry includes a configuration unit and a programmable delay line coupled to the configuration unit. The delay monitoring circuitry also includes a time-to-digital converter coupled to the programmable delay line and a feedback loop coupled to the time-to-digital converter. The feedback loop includes an evaluation circuit coupled to the configuration unit. The evaluation circuit may provide signals to the configuration unit to modify the delay of the programmable delay line.

The delay monitoring circuitry may operate during a calibration mode that is initiated when the clock frequency and/or supply voltage required by the integrated circuit change. The calibration mode of the delay monitoring circuit may also be initiated when several, independent working blocks on the integrated circuit are switched on or off independently by an operating system to provide a certain overall functionality of the integrated circuit. In particular, several blocks may be temporarily connected and disconnected from the local power supply distributed on the chip. In an illustrative example, cellular baseband integrated circuits may include blocks that are switched on when processing data according to the global system for mobile communications (GSM) communication standard and additional blocks that are switched on when processing data according to the code division multiple access (CDMA) or high speed packet access (HSPA) communication standards. Connecting and disconnecting circuit blocks on the integrated circuits may change the overall current consumption of the integrated circuit, which may generate transient supply voltage variations. During the calibration mode, a delay of the programmable delay line of the delay monitoring circuitry is measured by the evaluation circuit and compared to a target value. When the delay of the programmable delay line is different from the target value, the evaluation circuit provides signals to the configuration unit via the feedback loop to adjust the delay of the programmable delay line to meet the target value.

By utilizing on-chip self calibrating delay monitoring circuitry, measurement of delay of the integrated circuit may occur concurrently with normal chip operation. Additionally, configuration settings of the delay monitoring circuitry may take into consideration real-time, application specific, clock frequency and supply voltage values to more accurately provide an estimate of delay of the integrated circuit. Further, locating the delay monitoring circuitry on-chip, but outside of a critical path, may save chip area and allow the delay monitoring circuitry to be used to estimate the delay for a plurality of critical paths.

FIG. 1 is a schematic diagram of a system 100 including a computing device 102 having an integrated circuit with delay monitoring circuitry. The computing device 102 may include a personal computer, a laptop computer, a netbook computer, a personal digital assistant (PDA), a portable gaming device, a wireless communication device (e.g., a smart phone, a mobile handset, etc.), a set-top box, a game console, a portable music player, a router, a household appliance, a personal item (e.g., a wristwatch, calculator, etc.), other network connected devices, and so forth. The computing device 102 includes one or more processors 104 and memory 106. The computing device 102 also includes a voltage regulator 108 that generates and adjusts the power supply voltage of the processors 104.

The memory 106 may include read-only memory (ROM), random access memory (RAM), non-volatile memory, a hard disk, or any combination thereof. Additionally, the memory 106 may store one or more applications 110 including software instructions, firmware, or a combination thereof. For example, the applications 110 may include software instructions executable by the processor 104 to perform various processes of the computing device 102.

In an illustrative embodiment, the memory 106 may store an application to send and receive wireless signals related to telephone calls, such as voice traffic or control information. Further, the memory 106 may store an application, such as a browser application, to request and receive website data, an application to transmit and receive text messages, an application to transmit and receive pictures or images, an application to transmit and receive video messages, or any combination thereof. Further, the applications 110 may include a word processor application, a spreadsheet application, an email application, an operating system, one or more gaming applications, a GPS application, media playback applications, and so on.

The computing device 102 may also include a communication interface 112 coupled to the processor 104. The communication interface 112 may transmit and/or receive signals via a wireless connection, a wired connection, or both. For example, the communication interface 112 may transmit and/or receive signals via a base station included in a wide area wireless communication network, such as a GSM network, a universal mobile telecommunications system (UMTS) network, a CDMA network, an HSPA network, a general packet radio service (GPRS) network, an enhanced data rates for GSM evolution (EDGE) network, a worldwide interoperability for microwave access (WiMAX) network, a time division multiple access (TDMA) network, a frequency division multiple access (FDMA) network, a long term evolution (LTE) network, a WiMedia ultra wideband (UWB) network, or any combination thereof.

The communication interface 112 may also transmit and/or receive wireless signals via a communication satellite and transmit and/or receive wireless signals via a wireless access point included in a wide area wireless network or a wireless local area network, such as a Bluetooth network or an Institute of Electrical and Electronics Engineers (IEEE) 802.11 protocol network. Additionally, the communication interface 112 may transmit and/or receive wireless signals via a headset, such as a Bluetooth headset.

The processor 104 includes an integrated circuit 114. In one example, the integrated circuit 114 may be a central processing unit of the computing device 102. In another example, the integrated circuit 114 may be a baseband chip of the computing device 102 to encode and decode wireless communication signals. The integrated circuit 114 includes processing circuitry 116. The processing circuitry 116 executes processes of the computing device 102. For instance, the processing circuitry 116 may execute instructions of the applications 110.

The processing circuitry 116 may execute processes of the computing device 102 via a number of paths that include computational logic coupled to a sending flip-flop and a receiving flip-flop. The sending flip-flop may provide data to the computational logic at a first rising or falling clock edge and the output of the computational logic is sampled at the receiving flip-flop at a second rising or falling clock edge. The delay of each path may include delay from the launching flip-flop, delay from the sampling flip-flop, delay from the computational logic, and additional delays. The additional delays may comprise delays due to clock jitter and clock skew. The additional delays may also comprise delays due to supply voltage variations because the supply voltage required by one or more of the applications 110 may not be readily available to execute processes of the applications 110. The delays associated with the launching flip-flop, computational logic, and receiving flip-flop may be estimated with more accuracy than the delays due to supply voltage variations and clock jitter. When the total delay of a path exceeds the clock period, a setup timing violation occurs and data may not be stored properly and sampled in the receiving flip-flop at the second rising or falling clock edge, which may cause a computational error.

The integrated circuit 114 also includes delay monitoring circuitry 118 to estimate a delay of paths of the processing circuitry 116. Although FIG. 1 shows a single instance of delay monitoring circuitry 118, the integrated circuit 114 may include a number of delay monitoring circuits. The delay monitoring circuitry 118 may estimate delay of paths of the processing circuitry 116 to minimize or eliminate timing violations caused by changes in supply voltage and/or clock frequency of the computing device 102. For example, instructions of each of the applications 110 may be executed in association with a particular clock frequency and have particular supply voltage requirements. Consequently, when the processor 104 changes from executing instructions of a first application 110, such as processing a telephone call, to executing instructions of a second application 110, such as a web browsing application, the supply voltage or clock frequency may change based on the clock frequency and supply voltage requirements of the particular application 110. In another example, supply voltage and/or clock frequency changes may occur when the processor 104 begins executing processes of a number of applications that is larger or smaller than a current number of applications being executed.

The changes to the clock frequency and/or supply voltage may result in timing violations. To illustrate, when the supply voltage required by the processing circuitry 114 changes to execute processes of the applications 110, the voltage regulator 108 of the integrated circuit 114 may not able to quickly adapt the supply voltage according to the changes. Consequently, the delay in providing the proper supply voltage may increase, such that the total delay of a particular path exceeds the clock period.

The delay monitoring circuitry 118 includes a programmable delay line 120 that mimics the delay of paths of the processing circuitry 116. The programmable delay line 120 may be a digital-to-time converter that includes a number of delay elements. The output signal of the programmable delay line 120 is related to the amount of time required for an input signal to travel through a specified number of the delay elements. The amount of time that an input signal takes to propagate through a specified number of the delay elements of the programmable delay line 120 may represent the delay of one or more critical paths of the processing circuitry 116, and may be referred to in this disclosure as "the delay of the programmable delay line" or "the programmable delay line delay".

The number of delay elements that the input signal travels through before the programmable delay line 120 provides the output signal may be specified by a digital code provided to the programmable delay line 120 via a configuration register coupled to the programmable delay line 120. When the digital code specifies that the delay of the programmable delay line 120 is to increase, the input signal may propagate through more delay elements before the output signal is provided and when the delay of the programmable delay line 120 is to decrease, the input signal may propagate through fewer delay elements before the output signal is provided.

The delay monitoring circuitry 118 also includes a time-to-digital converter (TDC) 122. The TDC 122 may be coupled to the programmable delay line 118 and be used to measure the delay of the programmable delay line 120. The TDC 122 may include a chain of delay elements in series coupled to corresponding flip-flops. After an input signal has propagated through the programmable delay line 120, the flip-flops of the TDC 122 may be triggered (i.e. change state) sequentially as the input signal propagates through the chain of delay elements. In some instances, only a portion of the flip-flops are triggered before the state of each flip-flop is sampled. For example, an input signal may be provided to the programmable delay line 120 during a first rising clock edge and the state of each respective flip-flop may be sampled at a second rising clock edge. In this example, the output signals of the TDC 122 indicate the number of flip-flops that received the input signal and changed state before the second rising clock edge.

The number of flip-flops of the TDC 122 that are triggered before sampling the states of the flip-flops may be utilized as an indicator of the delay of the programmable delay line 120. For example, as the delay of the programmable delay line 120 increases, fewer flip-flops are triggered during a given clock cycle because more time is required for an input signal to travel through the programmable delay line 120. Conversely, as the delay of the programmable delay line 120 decreases, a larger number of flip-flops are triggered during a given clock cycle because the input signal takes less time to propagate through the programmable delay line 120.

Once the delay of the programmable delay line 120 has been measured, a digital code representing the delay is fed into a feedback loop 124. The feedback loop 124 includes an evaluation circuit that is used to calibrate the delay of the programmable delay line 120 during a calibration mode. For example, the evaluation circuit of the feedback loop 124 calibrates the delay of the programmable delay line 120 by comparing the output signals of the TDC 122 representing the delay of the programmable delay line 120 to a target value. The target value for the delay of the programmable delay line 120 may be based on a clock frequency and/or a supply voltage provided to the integrated circuit 114 at a particular time. Additionally, the clock frequency and supply voltage provided to the integrated circuit 114 may depend on the applications 110 being executed by the processing circuitry 116. When the delay of the programmable delay line 120 does not match the target value, the evaluation circuit of the feedback loop 124 may feed data back to a configuration register to change the configuration settings of the programmable delay line 120 to increase or decrease the delay of the programmable delay line 120, such that the corresponding delay of the programmable delay line 120 matches the target value.

After the calibration mode, the delay monitoring circuitry 118 may enter a measurement mode. During the measurement mode, the feedback loop 124 may be de-activated, such that signals from the feedback loop are not sent back to the configuration register. In this way, the delay of the programmable delay line 120 is not adjusted during the measurement mode. In addition, during the measurement mode, the evaluation circuit of the feedback loop 124 may be used to measure the delay of the programmable delay line 120 and compare the measured delay with a threshold delay to determine whether or not to initiate a countermeasure to avoid a timing violation. The countermeasure may include reducing the clock frequency or stopping the clock for a specified number of cycles. In an illustrative embodiment, during the measurement mode, the evaluation circuit of the feedback loop 124 measures the delay of the programmable delay line 120 based on the output signals of the TDC 122. The evaluation circuit then compares the delay of the programmable delay line 120 to a threshold value. The threshold value may represent the maximum delay for a particular path of the processing circuitry 116 before a timing violation occurs. When the delay of the programmable delay line 120 meets and/or exceeds the threshold value, the evaluation circuit of the feedback loop 124 provides an alert or warning signal that may trigger an appropriate countermeasure.

Figure 2:
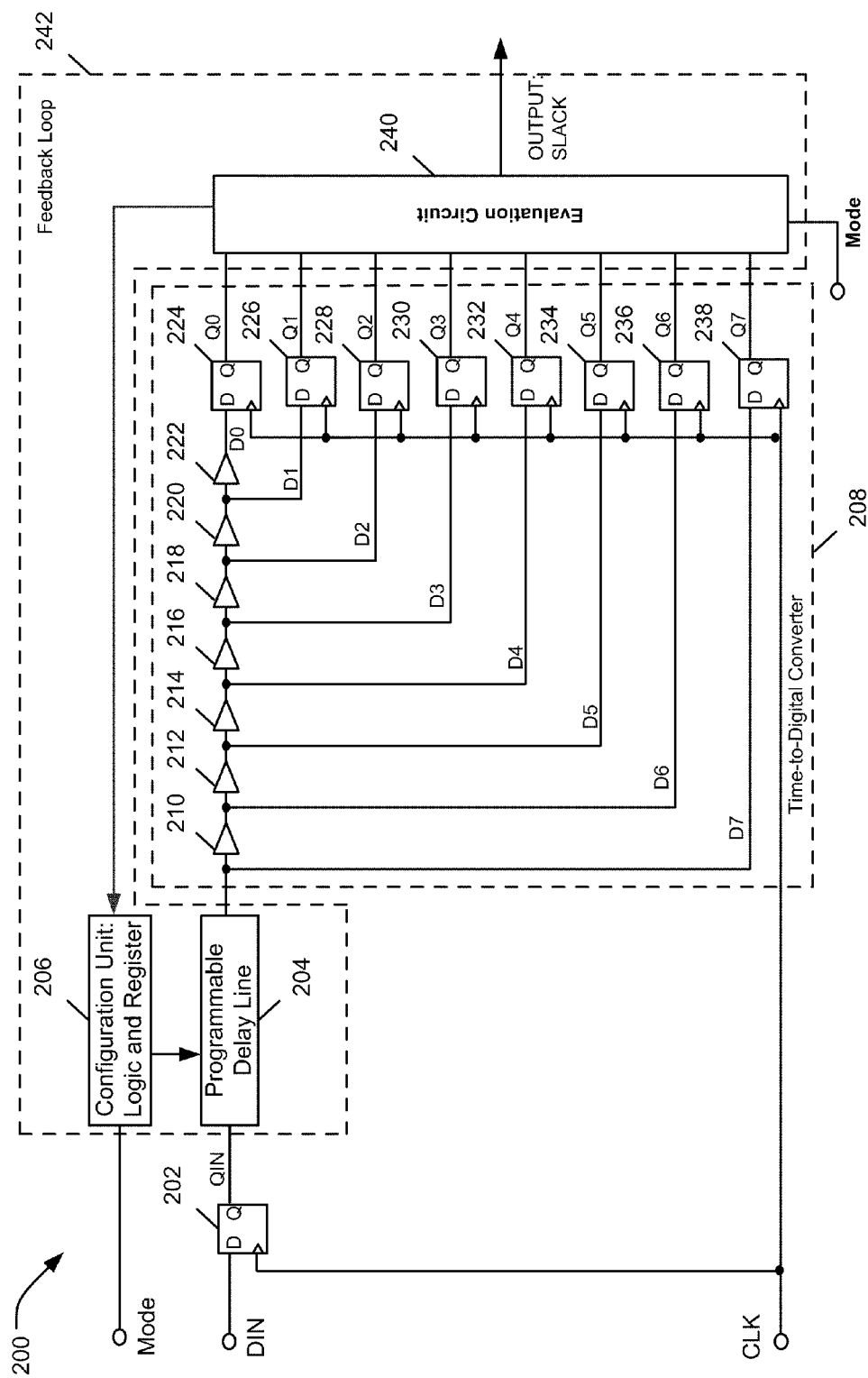
FIG. 2 is a schematic diagram of delay monitoring circuitry including a time-to-digital converter and a feedback loop.

FIG. 2 is a schematic diagram of delay monitoring circuitry 200 including a time-to-digital converter and a feedback loop. The delay monitoring circuitry 200 includes a launching flip-flop 202. The launching flip-flop 202 may be a D flip-flop, as illustrated in FIG. 2. The launching flip-flop 202 may receive an input, DIN, and a clock signal, CLK. The input, DIN, may be a 0-to-1 transition to change the state of the launching flip-flop 202 from "0" to "1". The launching flip-flop 202 may provide a signal, QIN, representing the 0-to-1 transition of DIN, to a programmable delay line 204. The signal QIN may be sent to the programmable delay line 204 at a first rising or falling clock edge. The programmable delay line 204 may be utilized to estimate at least a portion of a delay of a critical path of an integrated circuit, such as the integrated circuit 114 of FIG. 1.

The programmable delay line 204 is coupled to a configuration unit 206. Although FIG. 2 shows the programmable delay line 204 coupled to the configuration unit 206, the configuration unit 206 may be included as part of the programmable delay line 204. The configuration unit 206 provides configuration settings to the programmable delay line 204 to set the delay of the programmable delay line 204. The configuration unit 206 may include logic and a register for storing the configuration settings. In addition, the configuration unit 206 receives a signal, Mode. The Mode signal may specify that the delay monitoring circuitry 200 is to operate in a calibration mode or in a measurement mode. The Mode signal may be sent to the configuration unit 206 specifying that the delay monitoring circuitry 200 is to operate in a calibration mode when a frequency and power management unit of an integrated circuit identifies a change in clock frequency and/or supply voltage.

The programmable delay line 204 is also coupled to a time-to-digital converter (TDC) 208. The TDC 208 may measure the delay of the programmable delay line 204. The TDC 208 may include one or more non-inverting delay elements, such as the delay elements 210-222, coupled in series. In an alternative embodiment, the delay elements 210-222 may comprise inverting delay elements. Although FIG. 2 shows eight delay elements, the TDC 208 may include any number of delay elements. The number of delay elements and the size of the delay elements may depend on a length of the delay associated with one or more paths of an integrated circuit and/or a specified resolution used to quantify the delay of the programmable delay line 204. In some instances, each of the delay elements 210-222 may represent a delay between 10 ps to 100 ps. The one or more non-inverting delay elements 210-222 may comprise operational amplifiers, buffers, or a combination thereof. Each of the non-inverting delay elements 210-222 is coupled to a respective sampling flip-flop 224-238.

After the signal QIN propagates through the programmable delay line 204, signals associated with each delay element 210-222 are provided to the corresponding sampling flip-flops 224-238. For example, just before the signal QIN reaches the delay element 210, the signal D7 is propagated to the sampling flip-flop 238. Additionally, as the signal QIN propagates through the delay elements, the corresponding signals D6, D5, D4, and so on, are provided to their respective sampling flip-flops 236, 234, 232, etc. The output signals D7-D0 change the state of the sampling flip-flops 224-238, such as from a "0" to a "1" when the signal QIN represents a 0-to-1 transition.

The state of each of the sampling flip-flops 224-238 is sampled at a second rising or falling clock edge after the first rising or falling clock edge that caused the signal QIN to be sent from the launching flip-flop 202 to the programmable delay line 204. In an illustrative example, at the second rising or falling clock edge, the state of the sampling flip-flops 224-228 may be "0" and the state of the sampling flip-flops 230-238 may be "1". The latest sampling flip-flop to have a state of "1" before the second rising or falling clock edge may be referred to in this disclosure as a "leading '1'". Therefore, in this illustrative example, the "1" of the sampling flip-flop 230 would be referred to as the leading "1".

The evaluation circuit 240 receives the output signals from the sampling flip-flops 224-238. The output signals of the sampling flip-flops 224-238 may indicate a delay of the programmable delay line 204. For example, a larger number of the sampling flip-flops 224-238 changing state before the second rising or falling clock edge indicates a shorter delay of the programmable delay line 204 because the signal QIN is able to propagate through more of the delay elements 210-222 before the state of the flip-flops 224-238 is sampled. In another example, a smaller number of the sampling flip-flops changing state before the second rising or falling clock edge indicates a longer delay of the programmable delay line 204 because the signal QIN propagates through fewer of the delay elements 210-224 before the second rising or falling clock edge.

The evaluation circuit 240 may also receive the signal, Mode, indicating whether the delay monitoring circuitry 200 is operating in a calibration mode or a measurement mode. During a calibration mode, the evaluation circuit 240 may compare the output signals of the sampling flip-flops 224-238 to a target value. For example, the evaluation circuit 240 may compare a leading "1" of the sampling flip-flops 224-238 to a target leading "1". The evaluation circuit 240 may generate an output signal to send to the configuration unit 206 indicating that the delay of the programmable delay line 204 should increase or decrease based on the comparison of the output signals of the sampling flip-flops 224-228 with the target value. To illustrate, when the delay of the programmable delay line 204 is different from the target delay, the delay of the programmable delay line 204 may be adjusted such that the delay of the programmable delay line 204 matches the target delay. In this way, the evaluation circuit 240, the configuration unit 206, and the programmable delay line 204 form a feedback loop 242 that provides self-calibration of the programmable delay line 204 when conditions associated with a particular integrated circuit change, such as a change in supply voltage or a change in clock frequency. In addition, the feedback loop 242, the configuration unit 206, and the programmable delay line 204 may comprise a digital-to-time converter that converts a digital output signal of the evaluation circuit 240 to a time delay of the programmable delay line 204.

During a measurement mode, the evaluation circuit 240 may compare the output signals of the sampling flip-flops 224-238 to a threshold value to determine whether or not a timing violation may occur with respect to a particular path of an integrated circuit. For example, the evaluation circuit 240 may compare the delay of the programmable delay line 204 with a threshold hold delay. The difference between the programmable delay line 204 delay and the threshold delay may be referred to in this disclosure as "slack margin". In a particular illustration, the evaluation circuit 240 may compare a leading "1" based on output signals of the sampling flip-flops 224-238 with a threshold leading "1" and the difference between the leading "1" of the TDC 208 and a threshold leading "1" is the slack margin. The evaluation circuit 240 may provide an output signal, SLACK, that represents the slack margin. When the programmable delay line 204 delay is above the threshold value, the output signal, SLACK, may indicate a possible timing violation. Accordingly, a countermeasure may be initiated that includes a slowing of the clock frequency or stopping the clock for a specified number of cycles.

Figure 3:
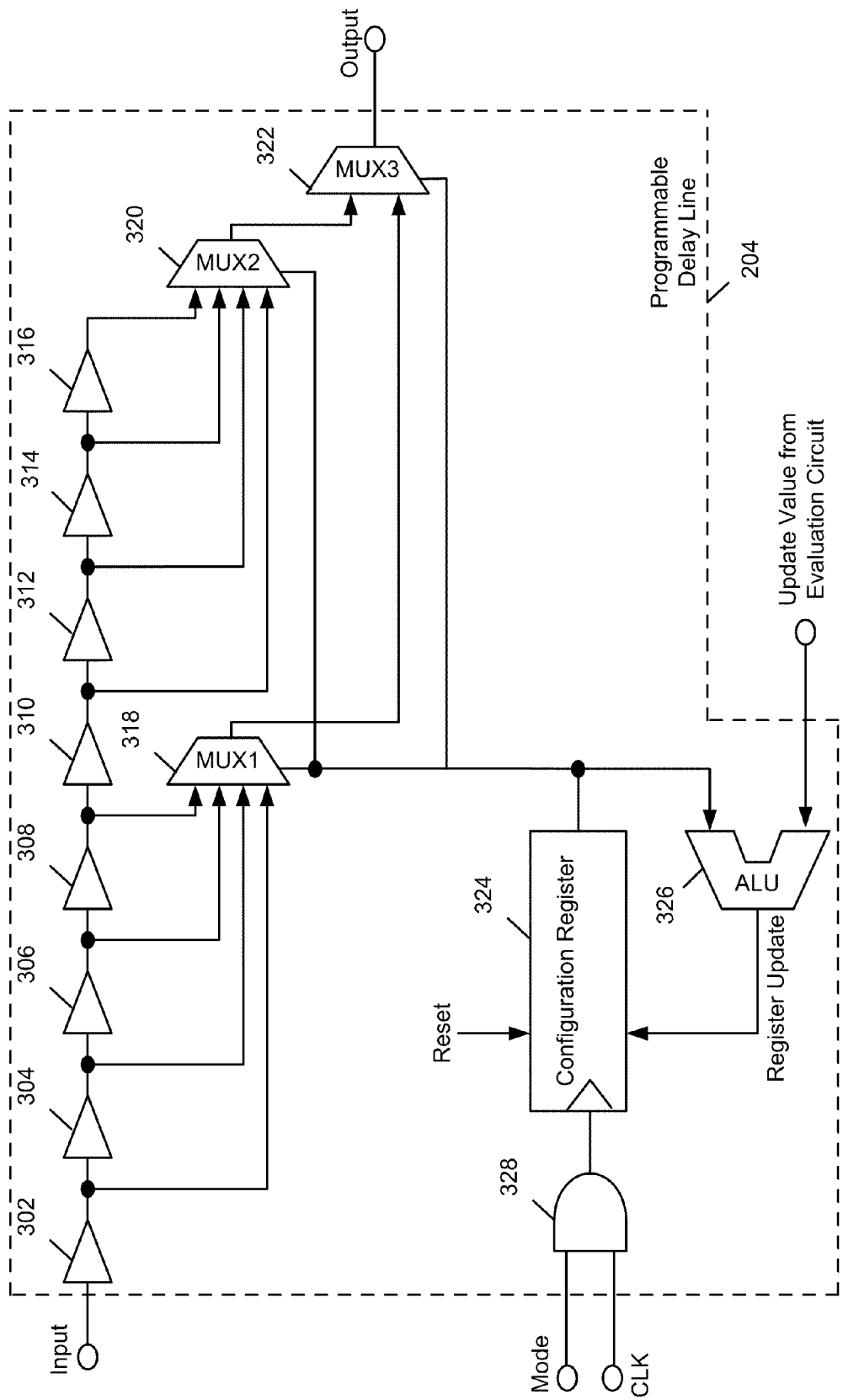
FIG. 3 is a schematic diagram of a programmable delay line of delay monitoring circuitry.

FIG. 3 is a schematic diagram of a programmable delay line 204 of delay monitoring circuitry, such as the delay monitoring circuitry 200 of FIG. 2. The programmable delay line 204 includes a number of non-inverting delay stages 302-316. In an alternative embodiment, the delay stages 302-316 may include inverting delay elements. The non-inverting delay stages 302-316 may include one or more buffers, operational amplifiers, or a combination thereof. In some instances, each of the delay stages 302-316 has approximately the same delay, such as a delay t0. The delay t0 may indicate an amount of time required for a signal, Input, to propagate through one of the delay stages 302-316. The number of delay stages of the programmable delay line 204 specifies the amount of delay that can be produced by the programmable delay line 204. Thus, the delay stages 302-316 may be used to produce a delay ranging from t0 to (8×t0). The delay of the delay stages 302-316 may depend on a size of a respective delay stage, such as the number of components of the delay stage, and/or the configuration of the respective delay stage. Although eight delay stages are shown in FIG. 3, any number of delay stages may be included in the programmable delay line 204 depending on the amount of delay required to estimate the delay of a path of an integrated circuit.

The programmable delay line 204 also includes a first multiplexer 318, a second multiplexer 320, and a third multiplexer 322. The multiplexers 318-322 may have a number of inputs. For example, the first multiplexer 318 and the second multiplexer 320 have four inputs and the third multiplexer 322 has two inputs. In particular, the first multiplexer 318 receives signals from the delay stages 302-308, the second multiplexer 320 receives signals from the delay stages 310-316, and the third multiplexer 322 receives signals from the first multiplexer 318 and the second multiplexer 320. The multiplexers 318-322 may have a different number of inputs than those shown in FIG. 3.

The programmable delay line 204 may include a configuration register 324. The configuration register 324 stores digitally coded configuration settings of the programmable delay line 204 that specify a delay to be provided by the programmable delay line 204. The delay may represent a time between an input to the first delay element 302 and the output of the third multiplexer 322. The combination of the delay stages 302-316 with the configuration register 324 may operate as a digital-to-time converter because the digitally-coded content of the configuration register 324 is transformed into a programmable delay via the delay stages 302-316.

The configuration register 324 provides input signals to the multiplexers 318-322 based on the configuration settings stored in the configuration register 324. For example, the input signals from the configuration register 324 may specify that a delay having a value of t0×2 is required. Thus, the signals to the multiplexers 318-322 may specify that the amount of time needed for the signal, Input, to travel through the delay stages 302 and 304 is provided as the output of the programmable delay line 204. In another example, the input signals from the configuration register 324 may specify that a delay having a value of t0×6 is required. Accordingly, the signals to the multiplexers 318-322 may specify that the amount of time needed for the signal, Input, to travel through the delay stages 302-308 is provided to the first multiplexer 318 and that the amount of time needed for the signal, Input, to travel through the delay stages 310 and 312 is provided to the second multiplexer 320. The first and second multiplexers 318 and 320 then provide their output to the third multiplexer 322 to produce the specified delay of the programmable delay line 204 as an output signal.

The values of the digital input signals provided by the configuration register 324 to the multiplexers 318-322 may be modified based on signals received from the arithmetic logic unit (ALU) 326 during a calibration mode of the programmable delay line 324. During the calibration mode, the logic 328 receives a signal, Mode, indicating the initiation of the calibration mode. The logic 328 also provides a local clock signal to the configuration register 324 based on the signal, CLK. In particular, when the logic 328 receives a Mode signal indicating a calibration mode of the programmable delay line 204, the logic 328 transmits the local clock signal to the configuration register 324 to facilitate changing the content of the configuration register 324. Further, the settings of the configuration register 324 may be reset to default settings in response to receiving the Reset signal.

The ALU 326 receives signals from an evaluation circuit, such as the evaluation circuit 240 of FIG. 2, to update the delay of the programmable delay line 204. For example, when the delay of the programmable delay line 204 is to be increased based on the signals received from the evaluation circuit, the configuration register 324 may provide signals to the multiplexers 318-322 to provide the increased delay. That is, the time taken for the signal, Input, to propagate through more of the delay stages 302-316 is considered when providing the output of the programmable delay line 204. In another example, when the delay of the programmable delay line 204 is to be decreased based on signals received from the evaluation circuit, the configuration register 324 may provide signals to the multiplexers 318-322 to produce the decreased delay. That is, the time taken for the signal, Input, to propagate through fewer of the delay stages 302-316 is considered when providing the output of the programmable delay line 204.

Figure 4:
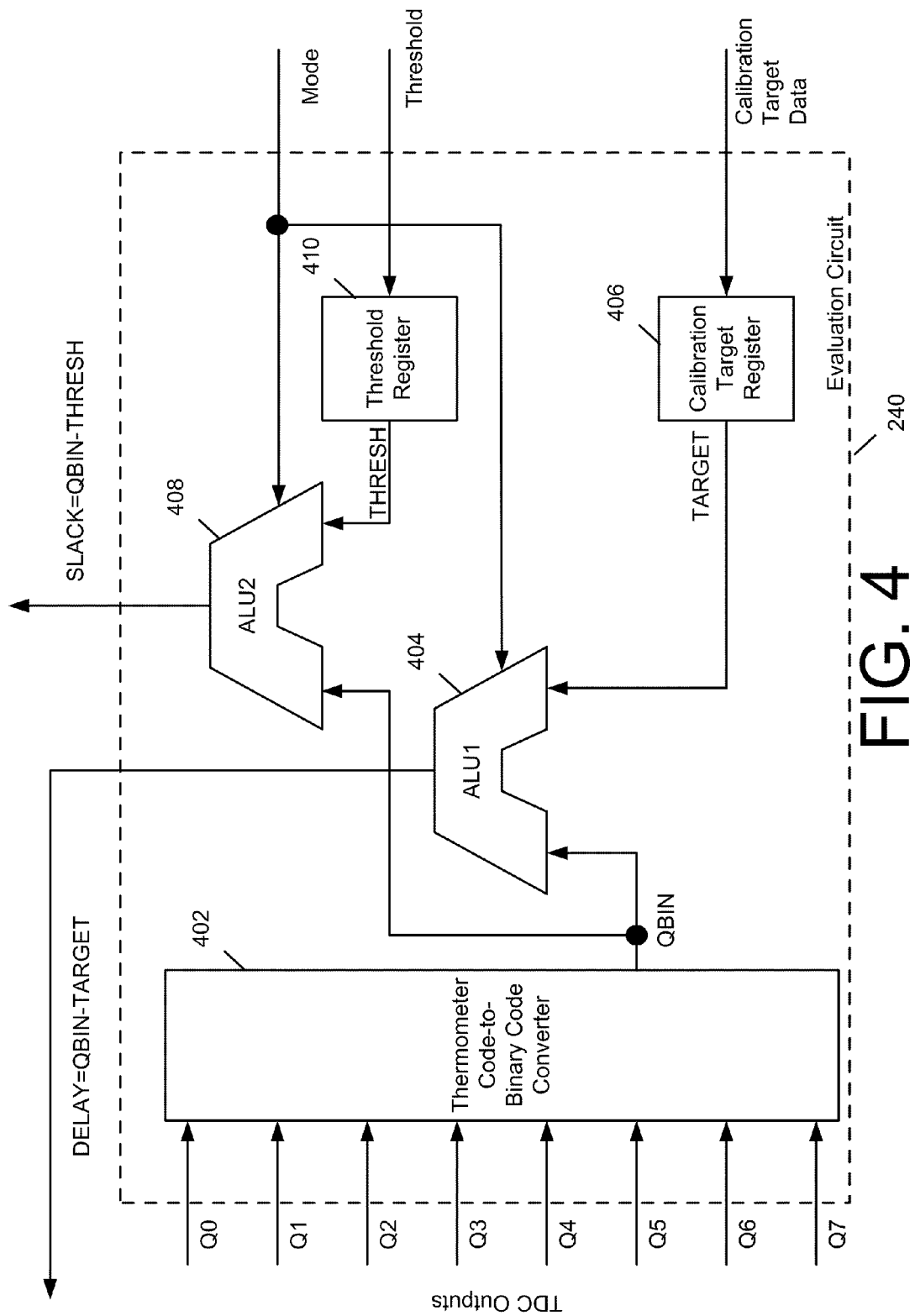
FIG. 4 is a schematic diagram of a first embodiment of an evaluation circuit of a feedback loop of delay monitoring circuitry.

FIG. 4 is a schematic diagram of a first embodiment of an evaluation circuit 240 of a feedback loop of delay monitoring circuitry. The evaluation circuit 240 includes a thermometer code-to-binary code converter 402. The thermometer code-to-binary code converter 402 receives output signals Q0-Q7 from the sampling flip-flops of a time-to-digital converter, such as the time-to-digital converter 208 of FIG. 2. The thermometer code-to-binary code converter 402 may include an arrangement of logic circuitry to produce a binary output signal, QBIN, from the signals Q0-Q7. The output signal QBIN indicates the delay of a programmable delay line of delay monitoring circuitry, such as the programmable delay line 204 of FIG. 2 and FIG. 3.

The output signal QBIN of the thermometer code-to-binary code converter 402 is provided to a target arithmetic logic unit 404 during a calibration mode of the delay monitoring circuitry. The target arithmetic logic unit 404 compares a value of the signal QBIN with a value of the signal, TARGET, received from a calibration target register 406. The value of the signal TARGET represents a target value for the delay of the programmable delay line. The calibration target data used to generate the TARGET signal is stored in the calibration target register 406.

The target value for the delay of the programmable delay line may be based on process conditions of an integrated circuit, where the delay of one or more paths of the integrated circuit is being mimicked by the programmable delay line. The process conditions may include the supply voltage and/or the clock frequency provided to the integrated circuit at a given time. Further, the process conditions may depend on an application that is being executed via the integrated circuit.

The output signal of the target arithmetic logic unit 404, DELAY, indicates any difference between the delay of the programmable delay line and the target value for the delay of the programmable delay line specified by the signal TARGET. The DELAY signal of the target ALU 404 is fed back to a configuration unit of the delay monitoring circuitry, such as the configuration unit 206 of FIG. 2. The DELAY signal may be used by the configuration unit to adjust the delay of the programmable delay line. For example, the DELAY signal of the target ALU 404 may indicate that the delay of the programmable delay line is larger than the target delay. In this example, the delay of the programmable delay line may be decreased to match the target value. In another example, the DELAY signal may indicate that the delay of the programmable delay line is smaller than the target delay. Consequently, the delay of the programmable delay line may be increased to match the target value.

The target ALU 404 also receives a signal MODE indicating whether the delay monitoring circuitry is in a calibration mode or a measurement mode. When the delay monitoring circuitry is in a calibration mode, the target ALU 404 provides the output signal DELAY to the configuration unit of the delay monitoring circuitry. When the delay monitoring circuitry is in a measurement, the target ALU 404 is de-activated.

The MODE signal is also provided to a threshold ALU 408. When the delay monitoring circuitry is in a measurement mode, the threshold ALU 408 compares the delay of the programmable delay line represented by a value of the signal, QBIN, with a value of the signal, THRESH, received from a threshold register 410. The THRESH signal may represent a delay of one or more paths of an integrated circuit that causes a timing violation or indicates that a timing violation is imminent. The output signal SLACK provided by the threshold ALU 408 indicates any difference between the delay of the programmable delay line and a threshold value for the delay of one or more paths of an integrated circuit. The signal SLACK may be provided to a software module, a central processing unit, or other logic of a computing device that issues alerts or initiates countermeasures when a timing violation has occurred or is imminent. For example, when the signal SLACK is below a certain value, a countermeasure may be initiated, such as stopping the clock for a certain number of cycles or reducing the clock frequency.

Figure 5:
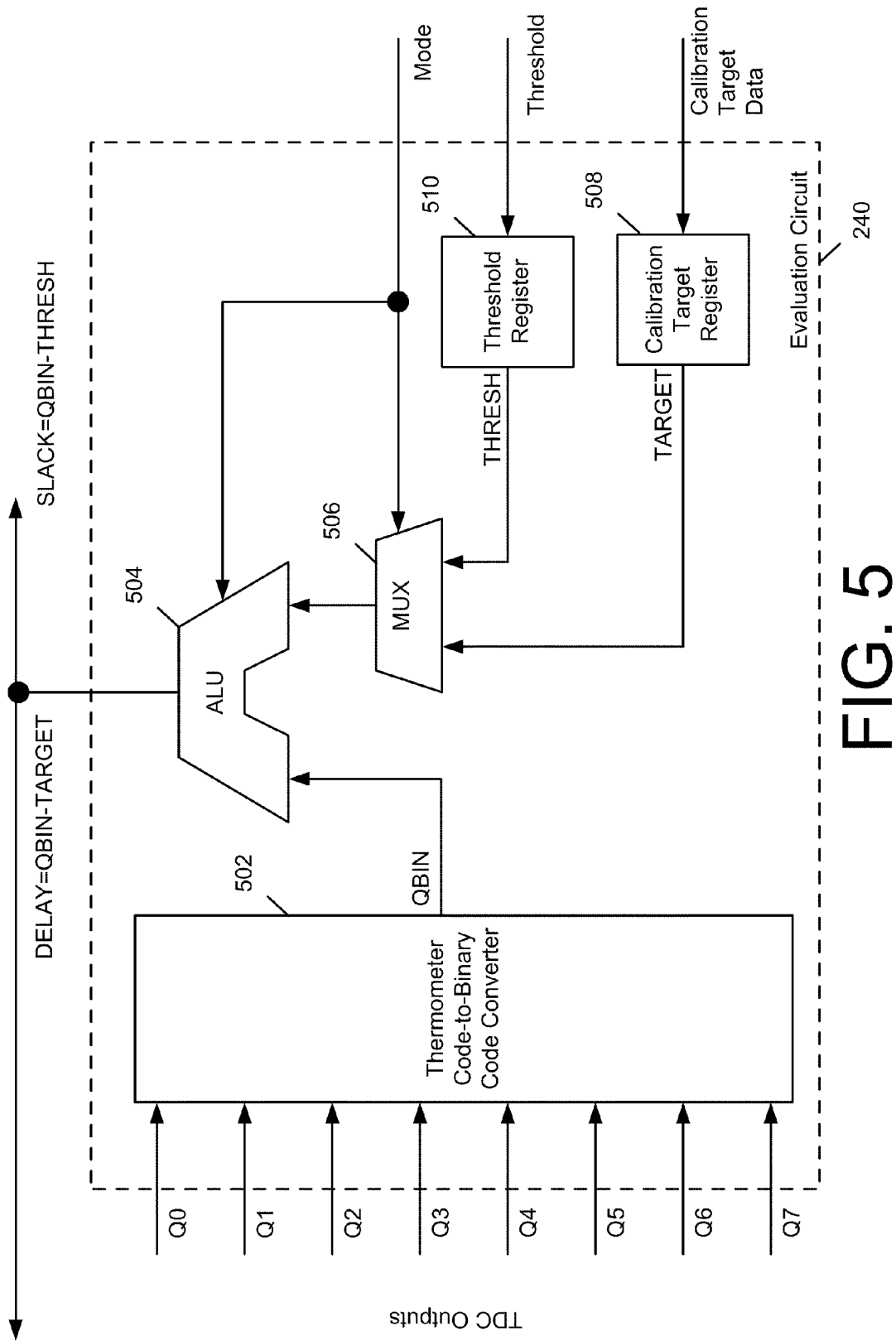
FIG. 5 is a schematic diagram of a second embodiment of an evaluation circuit of a feedback loop of delay monitoring circuitry.

FIG. 5 is a schematic diagram of a second embodiment of an evaluation circuit of a feedback loop of delay monitoring circuitry. The evaluation circuit 240 includes a thermometer code-to-binary code converter 502. The thermometer code-to-binary code converter 502 receives output signals Q0-Q7 from the sampling flip-flops of a time-to-digital converter, such as the time-to-digital converter 208 of FIG. 2. The thermometer code-to-binary code converter 502 may include an arrangement of logic circuitry to produce a binary output signal, QBIN, from the signals Q0-Q7 received from the time-to-digital converter. The binary output signal, QBIN, represents the delay of a programmable delay line of delay monitoring circuitry, such as the programmable delay line 204 of FIG. 2.

The output signal QBIN of the thermometer code-to-binary code converter 502 is provided to an arithmetic logic unit (ALU) 504. The ALU 504 compares the signal QBIN with a particular output signal from a multiplexer 506 depending on the mode of the delay monitoring circuitry. The signal, Mode, provided to the ALU 504 and the multiplexer 506 indicates whether the delay monitoring circuitry is in a calibration mode or a measurement mode.

During the calibration mode, the arithmetic logic unit 504 compares a value of the signal QBIN with a value of the signal TARGET received from the calibration target register 508. The arithmetic logic unit 504 provides an output signal, DELAY, during the calibration mode. The DELAY signal indicates any difference between the delay of the programmable delay line and the target value for the delay of the programmable delay line specified by the signal TARGET. The DELAY signal of the ALU 504 is fed back to a configuration unit of the delay monitoring circuitry, such as the configuration unit 206 of FIG. 2. The DELAY signal may be used by the configuration unit to adjust the delay of the programmable delay line.

When the delay monitoring circuitry is in a measurement mode, the multiplexer 506 receives a signal THRESH from a threshold register 510. The THRESH signal may represent a delay of one or more paths of an integrated circuit that causes a timing violation or indicates that a timing violation is imminent. The multiplexer 506 provides the signal THRESH to the ALU 504. The ALU 504 compares the delay of the programmable delay line represented by a value of the signal, QBIN, with the value of the THRESH signal. The output signal SLACK provided by the threshold ALU 504 during the measurement mode indicates any difference between the delay of the programmable delay line and a threshold value for the delay of one or more paths of an integrated circuit. The signal SLACK may be provided to a software module, a central processing unit, or other logic of a computing device that issues alerts or initiates countermeasures when a timing violation has occurred or is imminent.

Figure 6:
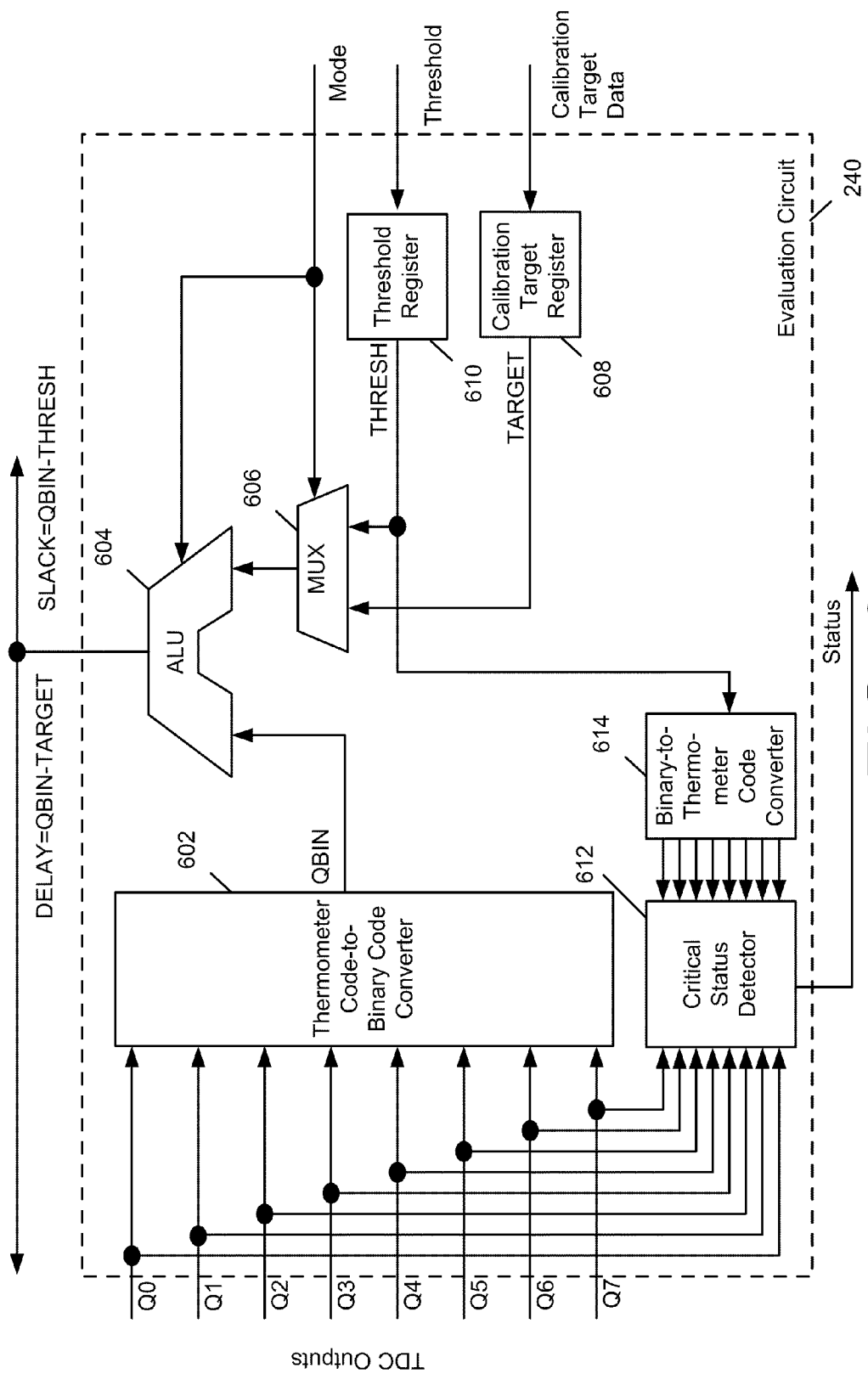
FIG. 6 is a schematic diagram of a third embodiment of an evaluation circuit of a feedback loop of delay monitoring circuitry.

FIG. 6 is a schematic diagram of a third embodiment of an evaluation circuit of a feedback loop of delay monitoring circuitry. The evaluation circuit 240 includes a thermometer code-to-binary code converter 602. The thermometer code-to-binary code converter 602 receives output signals Q0-Q7 from the sampling flip-flops of a time-to-digital converter, such as the time-to-digital converter 208 of FIG. 2. The thermometer code-to-binary code converter 602 may include an arrangement of logic circuitry to produce a binary output signal, QBIN, from the signals Q0-Q7 received from the time-to-digital converter. The binary output signal, QBIN, represents the delay of a programmable delay line of delay monitoring circuitry, such as the programmable delay line 204 of FIG. 2.

The output signal QBIN of the thermometer code-to-binary code converter 602 is provided to an arithmetic logic unit (ALU) 604. The ALU 604 compares the signal QBIN with an output signal from a multiplexer 606 depending on the mode of the delay monitoring circuitry. The signal, Mode, provided to the ALU 604 and the multiplexer 606 indicates whether the delay monitoring circuitry is in a calibration mode or a measurement mode.

During the calibration mode, the arithmetic logic unit 604 compares a value of the signal QBIN with a value of the signal TARGET received from the calibration target register 608. The arithmetic logic unit 604 provides an output signal, DELAY, during the calibration mode. The DELAY signal indicates any difference between the delay of the programmable delay line and the target value for the delay of the programmable delay line specified by the signal TARGET. The DELAY signal of the ALU 604 is fed back to a configuration unit of the delay monitoring circuitry, such as the configuration unit 206 of FIG. 2. The DELAY signal may be used by the configuration unit to adjust the delay of the programmable delay line.

When the delay monitoring circuitry is in a measurement mode, the multiplexer 606 receives a signal THRESH from a threshold register 610. The THRESH signal may represent a delay of one or more paths of an integrated circuit that causes a timing violation or indicates that a timing violation is imminent. The multiplexer 606 provides the signal THRESH to the ALU 604. The ALU 604 compares the delay of the programmable delay line represented by a value of the signal, QBIN, with the value of the THRESH signal. The output signal SLACK provided by the threshold ALU 604 during the measurement mode indicates any difference between the delay of the programmable delay line and a threshold value for the delay of one or more paths of an integrated circuit. The signal SLACK may be provided to a software module, a central processing unit, or other logic of a computing device that issues alerts or initiates countermeasures when a timing violation has occurred or is imminent.

The evaluation circuit 240 also includes a critical status detector 612 and a binary-to-thermometer code converter 614 to provide a thermometer coded version of the threshold value to the critical status detector 612. In some instances, the evaluation circuit 240 may utilize the critical status detector 612 to determine whether a path of an integrated circuit is in a critical state rather than utilizing the multiplexer 606 and the ALU 604. For example, the evaluation circuit 240 may utilize the critical status detector 612 when a quick evaluation is required to identify whether or not a path of an integrated circuit is in a critical state because of rapid supply voltage and/or clock frequency changes. In some embodiments, rapid supply voltage and/or clock frequency changes may occur when an integrated circuit is functioning as a microprocessor of a computing device.

The critical status detector 612 compares the thermometer coded value of the delay of the programmable delay line represented by the signals Q0-Q7 and the thermometer coded value of the threshold value. Based on the comparison between the thermometer coded values of the delay of the programmable delay line and the threshold value, the critical status detector 612 provides a binary output signal, Status, that indicates whether the delay of the programmable delay line is above or below the threshold value. For example, when the delay of the programmable delay line is less than the threshold value, then the signal Status may indicate that a timing violation has occurred or is imminent. When the delay of the programmable delay line is greater than the threshold value, then the Status signal may indicate that a timing violation is not likely to occur or is not imminent. The Status signal may serve as a warning signal to initiate countermeasures to offset or prevent any timing violations of an integrated circuit. Thus, by directly comparing the thermometer coded values for the programmable delay line delay and threshold value to provide a binary output signal, the critical status detector 612 may more quickly provide an indication regarding whether a timing violation is imminent or occurring by avoiding the more complicated computations of the ALU 604 and the multiplexer 606.

The SLACK output signal computed by the first, second, or third embodiments of the evaluation circuits 240 shown in FIGS. 4-6, may be further processed by a central processing unit, such as the processor 104 of FIG. 1, on the integrated circuit. The post processing of the SLACK signal may comprise combining multiple SLACK signals of multiple delay monitoring circuits to identify possible timing violations for a number of paths of the integrated circuit. The central processing unit may generate a total chip status signal and initiate a countermeasure in response to the SLACK signals received from one or more delay monitoring circuits. The central processing unit may also collect statistical information about the frequency of occurrence of specific SLACK values and count and store a number of critical timing states.

Figure 7:
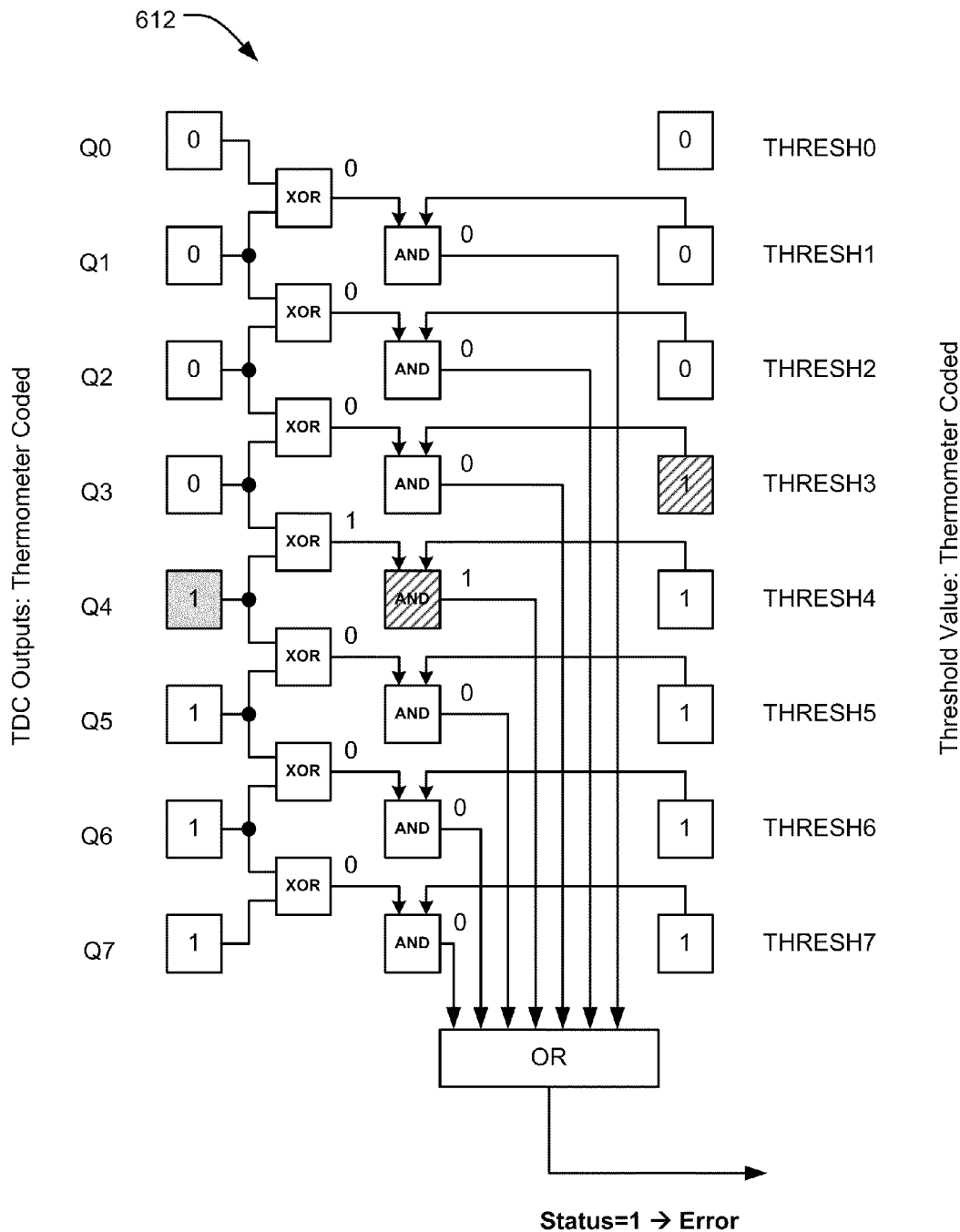
FIG. 7 is a logic diagram of a critical status detector of an evaluation circuit of delay monitoring circuitry showing an error occurring during a measurement mode.

FIG. 7 is a logic diagram of a critical status detector 612 of an evaluation circuit of delay monitoring circuitry where an error occurs during a measurement mode. FIG. 7 shows a thermometer coded version of output signals of a time-to-digital converter, such as the time to digital converter 208 of FIG. 2, as represented by the values of the signals Q0-Q7. FIG. 7 also shows a thermometer coded version of a threshold value for the delay of the one or more paths of the integrated circuit, as represented by the values of the signals THRESH0-THRESH7.

The values of the signals Q0-Q7 represent a delay of a programmable delay line of delay monitoring circuitry, where the delay monitoring circuitry is utilized to mimic one or more paths of an integrated circuit. Each of the output signals Q0-Q7 may be produced by a respective flip-flop of a plurality of flip-flops of a time-to-digital converter, such as the flip-flops 224-238 of FIG. 2. Thus, the signals Q0-Q7 may indicate a change in state of corresponding flip-flops within a given clock cycle. The delay of a path of an integrated circuit may be estimated based on the number of signals having a value of "1". In the example shown in FIG. 7, the length of a delay estimate is shown as increasing from bottom to top, such that the shortest delay estimated would be indicated by Q0-Q7 having a value of "1" and the longest delay estimated would be indicated by Q0-Q7 having a value of "0". In the particular example of FIG. 7, the length of a delay estimate for a path of an integrated circuit is indicated by the value of "1" for signals Q7-Q4.

Further, the values of the signals THRESH0-THRESH7 indicate a threshold delay for a path of an integrated circuit. The length of a threshold delay is also shown as increasing from bottom to top, such that the longest delay estimated would be indicated by THRESH0-THRESH7 having a value of "0" and the shortest delay estimated would be indicated by THRESH7-THRESH0 having a value of "1". In the particular example of FIG. 7, the length of the threshold delay for a path of an integrated circuit is indicated by the value of "1" for signals THRESH7-THRESH3.

The values of each of the output signals Q0-Q7 are sent to XOR logic and then to AND logic. The AND logic also receives signals THREHS0-THRESH7. The output of the XOR logic indicates a difference between two consecutive signals. For example, an output of "0" for the XOR logic indicates the same value for two consecutive signals, such as the value of "0" for the signals Q1 and Q2 or the value "1" for the signals Q4 and Q5. An output of "1" for the XOR logic indicates a difference between the values of two consecutive signals. For example, the XOR logic receiving the value of the signals of Q3 and Q4 produces an output of "1" because the value of the signal Q3 is "0" and the value of the signal Q4 is "1".

The AND logic produces a "1" when the input values from the XOR logic and the corresponding values of the signals THRESH0-THRESH7 are both "1" and the AND logic produces a "0" for other combinations of input values. When the length of the estimated delay for an integrated circuit path is less than the threshold delay, the output for each instance of the AND logic is "0". However, when the length of the estimated delay for an integrated circuit path exceeds the threshold delay, the output of one instance of the AND logic will be "1". The output of each instance of the AND logic is sent to OR logic. When the output signal of one instance of the AND logic is "1", the output of the OR logic will also be "1", indicating an error. When the output signal of each instance of the AND logic is "0", the output of the OR logic will be "0" indicating that no error is occurring.

As shown in FIG. 7, a difference is detected with respect to the estimated integrated circuit path delay and the threshold delay. In particular, the estimated delay for the integrated circuit path is greater than the threshold delay as indicated by the mismatch between the "0" of Q3 and the "1" of THRESH3. Thus, the output of the shaded instance of the AND logic is "1", producing an output of "1" at the OR logic. Consequently, the binary signal Status provided by the critical status detector 612 is a warning signal indicating an error is occurring or imminent with respect to the particular integrated circuit path being evaluated.

Figure 8:
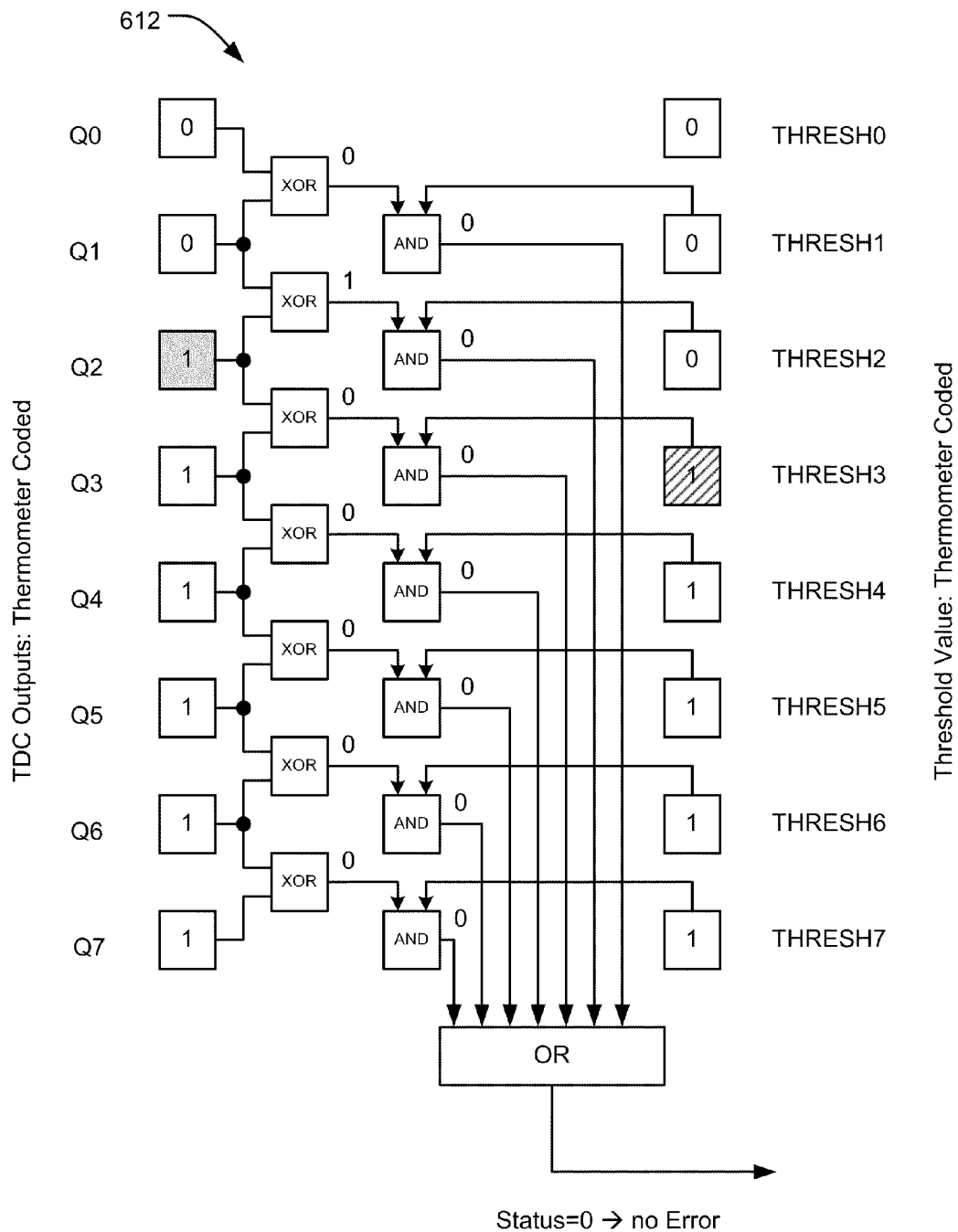
FIG. 8 is a logic diagram of a critical status detector of an evaluation circuit of delay monitoring circuitry showing that no error is detected during a measurement mode.

FIG. 8 is a logic diagram of a critical status detector 612 of an evaluation circuit of delay monitoring circuitry where no error is detected during a measurement mode. The arrangement of XOR and AND logic in FIG. 8 is similar to the arrangement of XOR and AND logic of FIG. 7. In addition, the critical status detector 612 of FIG. 8 also receives the values of signals Q0-Q7 from a time-to-digital converter indicated an estimated length of delay for a path of an integrated circuit and the values of signals THRESH0-THRESH7 indicating a threshold value for the delay of the integrated circuit path. In the particular example of FIG. 8, the length of a delay estimate for a path of an integrated circuit is indicated by the value of "1" for signals Q7-Q2 and the length of the threshold delay for a path of an integrated circuit is indicated by the value of "1" for signals THRESH7-THRESH3. Consequently, the estimated delay length of a path of an integrated circuit is less than the threshold value for the delay of the path as indicated by the mismatch between the "1" of Q2 and the "0" of THRESH2. Thus, the value of each of instance of the AND logic is "0" and the value of the OR logic is "0". When the value of the OR logic is "0", the Status signal of the critical status detector 612 indicates that no error is occurring with respect to the delay of the particular integrated circuit path being evaluated.

The Status signals produced via the critical status detectors shown in FIGS. 6-8 may be collected at a central processing unit. In a particular embodiment, if one or more delay monitoring circuitries are placed on an integrated circuit to measure delay variations at different chip positions on different functional blocks, the Status signals of multiple critical status detectors may be combined in the central processing unit. The central processing unit may generate a total chip status signal and/or initiate a countermeasure based on the signals received from the multiple critical status detectors of the integrated circuit. The central processing unit may be connected to the power management unit of the integrated circuit and/or to a phase locked loop (PLL) to initiate a countermeasure. The countermeasures may include altering the supply voltage and/or reducing the clock frequency. A further countermeasure may include initiating a local clock gating to stop the clock at certain functional blocks on the integrated circuit. The central processing unit may also include a counting unit to count and store the number of critical states indicated by the Status signals and to generate statistical information regarding the frequency of occurrence of values of the Status signals.

Figure 9:
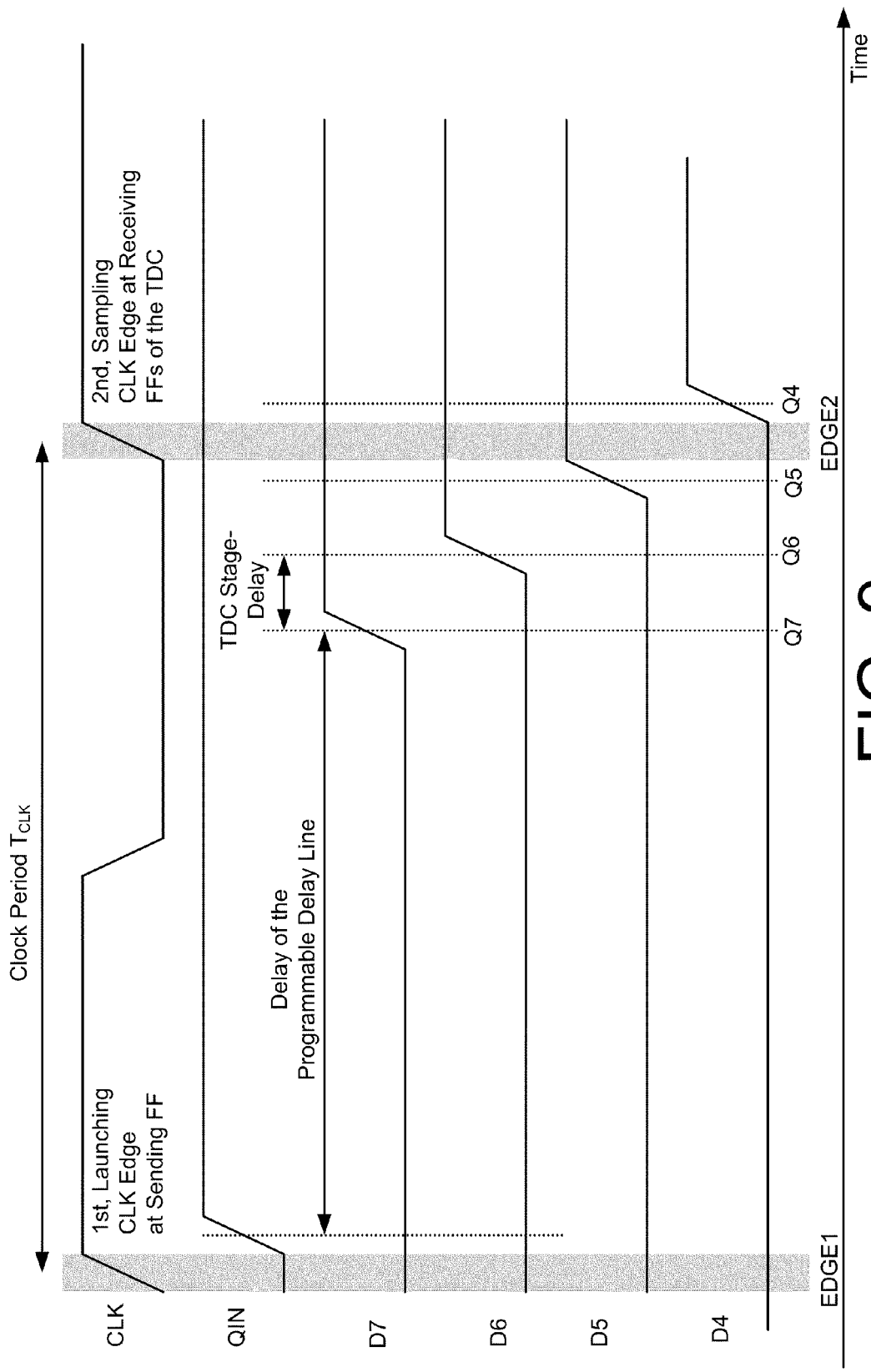
FIG. 9 is a timing diagram showing an example of measuring a delay of a programmable delay line of delay monitoring circuitry.

FIG. 9 is a timing diagram showing an example of measuring a delay of a programmable delay line of delay monitoring circuitry. FIG. 9 illustrates launching an input signal, such as a 0-to-1 transition from a sending flip-flop to a programmable delay line at a first rising clock edge, EDGE1. In a particular example, the input signal may be QIN of FIG. 2 that is provided from the launching flip-flop 202 to the programmable delay line 204. In an alternative embodiment, the input signal may be launched at a first falling clock edge.

The delay of the programmable delay line is the amount of time that elapses between receiving the input signal at the programmable delay line to a change in state of a receiving flip-flop coupled to a first delay element of a plurality of delay elements coupled to the programmable delay line. The plurality of delay elements may each be coupled to a corresponding receiving flip-flop and the plurality of delay elements and receiving flip-flops may be used to measure the delay of the programmable delay line. In a particular example, the plurality of delay elements may be coupled in series, such as the delay elements 210-222 of FIG. 2, and be coupled to corresponding receiving flip-flops, such as the sampling flip-flops 224-238 of FIG. 2.

In FIG. 9, the signals D7-D4 indicate an input signal provided to respective delay elements. For example D7 represents the input signal provided to a first delay element and corresponding receiving flip-flop (e.g. 210 and 238 of FIG. 2) and D6 represents the input signal provided to a second delay element and corresponding receiving flip-flop (e.g. 212 and 236 of FIG. 2). Additionally, the dashed lines Q7-Q4 indicate a state change of the corresponding receiving flip-flops upon receipt of the input signal. To illustrate, when the input signal is a 0-to-1 transition, the state of the receiving flip-flops may change from 0 to 1 when the input signal is received. The TDC stage delay indicates an amount of time needed for the input signal to propagate from one delay element to a succeeding delay element.

The state of the receiving flip-flops is sampled at a second rising clock edge, EDGE2. In an alternative embodiment, the state of the receiving flip-flops may be sampled at a second falling clock edge. In the example shown in FIG. 9, the receiving flip-flops that receive the signals D7, D6, and D5 change state before EDGE 2, but the receiving flip-flop that receives the signal D4 does not change state before EDGE2. During a calibration mode of the programmable delay line, the number of receiving flip-flops that change state may be used to measure the delay of the programmable delay line. For example, the longer the programmable delay line delay, the fewer receiving flip-flops that change state before EDGE2. Additionally, the shorter the programmable delay line delay, the more receiving flip-flops that change state before EDGE2. Thus, the delay of the programmable delay line may be measured in a single clock cycle.

The number of receiving flip-flops that change state before EDGE2 may be compared to a target value that indicates a target delay for the programmable delay line. If the number of flip-flops triggered before EDGE2 is less than the target value, then the delay of the programmable delay line may be decreased, such that more receiving flip-flops are triggered before EDGE2 to match the target value. In addition, when the number of flip-flops triggered before EDGE2 is more than the target value, the delay of the programmable delay line may be increased, such that fewer receiving flip-flops change state before EDGE2 to match the target value.

Figure 10:
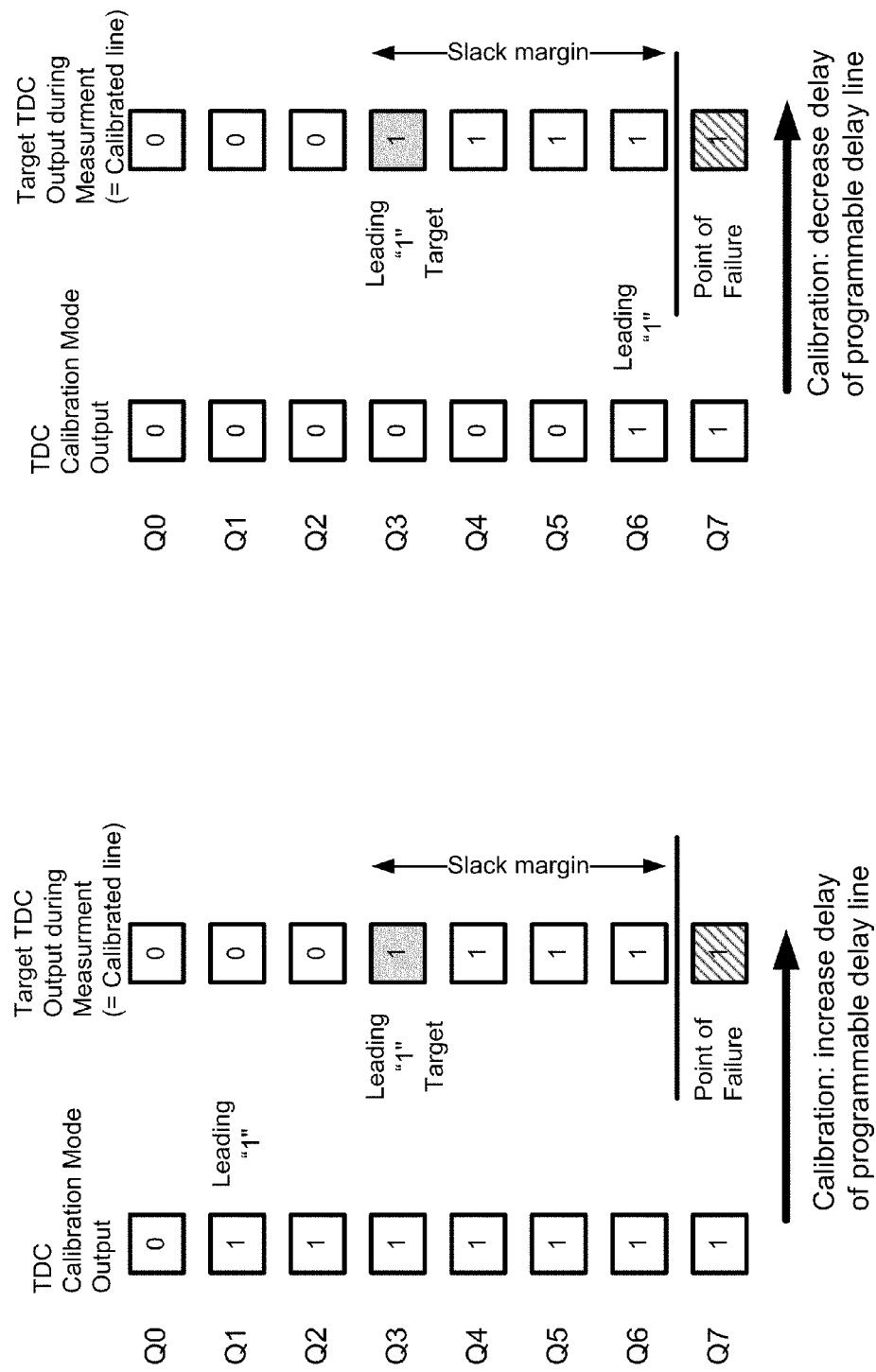
FIG. 10A illustrates values of output signals of sampling flip-flops of a time-to-digital converter with respect to target values of the output signals indicating that the delay of a programmable delay line is to increase during a calibration mode.
FIG. 10B illustrates values of output signals of sampling flip-flops of a time-to-digital converter with respect to target values of the output signals indicating that the delay of a programmable delay line is to decrease during a calibration mode.

FIG. 10A illustrates values of output signals of sampling flip-flops of a time-to-digital converter with respect to target values of the output signals indicating that the delay of a programmable delay line is to increase during a calibration mode. FIG. 10B illustrates values of output signals of sampling flip-flops of a time-to-digital converter with respect to target values of the output signals indicating that the delay of a programmable delay line is to decrease during a calibration mode. The programmable delay line and time-to-digital converter may be included in delay monitoring circuitry, such as the delay monitoring circuitry 200 of FIG. 2 that is utilized to estimate the delay of an integrated circuit path. The delay of the programmable delay line may be represented by the output signals Q0-Q7 produced by sampling flip-flops of the time-to-digital converter when the states of the sampling flip-flops are sampled, such as during a given rising or falling clock edge. The state of each of the sampling flip-flops depends on whether or not a respective sampling flip-flop has received a 0-to-1 transition input signal before the sampling of the states of the sampling flip-flops.

In the illustrative examples of FIG. 10A and FIG. 10B, the value of signal Q7 represents a state of a first sampling flip-flop to receive a 0-to-1 transition input signal after the input signal has propagated through the programmable delay line. The value of signal Q0 represents a state of a last sampling flip-flop to receive the 0-to-1 transition input signal after the input signal has propagated through the programmable delay line. Thus, the length of delay of the programmable delay line decreases as the values of the signals Q7-Q0 change from "0" to "1" from bottom to top. For example, a shortest programmable delay line delay would be represented as a value of "1" for each of the signals Q0-Q7 because all of the sampling flip-flops would have been able to change state before the states of the flip-flops are sampled. In addition, a longest programmable delay line delay would be represented as a value of "0" for each of the signals Q0-Q7 because none of the sampling flip-flops would have been able to change state before the states of the flip-flops are sampled.

A point of failure may be indicated by the output signal Q7. Thus, the delay of the programmable delay line associated with triggered the sampling flip-flop producing the signal Q7 represents the shortest delay of an integrated circuit path without causing a timing violation. Consequently, when the value of the signal Q7 is "0" a timing violation may be occurring or is imminent with respect to the integrated circuit path and when the value of the signal Q7 is "1" a timing violation for the integrated circuit path may not be occurring.

The first column of values for the signals Q0-Q7 of FIG. 10A and FIG. 10B are the values of the signals Q0-Q7 as measured during a calibration mode of the delay monitoring circuitry. In addition, the second column of values for the signals Q0-Q7 of FIG. 10A and FIG. 10B are the target values of the signals Q0-Q7. The target values for the signals Q0-Q7 represent a target delay for a particular integrated circuit path.

The "leading '1'" of FIG. 10A and FIG. 10B is the output signal of the last sampling flip-flop to change state before the states of the sampling flip-flops are sampled. The leading "1" of FIG. 10A is represented by the output signal Q1. In addition, the leading "1" of FIG. 10B is represented by the signal Q6. The "target leading '1'" of FIG. 10A and FIG. 10B represents a target sampling flip-flop that is to change state before the states of the sampling flip-flops are sampled. The difference between the target leading "1" and the point of failure is referred to as the "slack margin".

In FIG. 10A, the values of the signals Q0-Q7 sampled during the calibration mode are different from the target values of the signals Q0-Q7 indicating that the delay of the programmable delay line should be adjusted to more accurately estimate the delay of an integrated circuit path. In particular, since the leading "1" of the calibration mode output occurs at Q1 and the target leading "1" is positioned at Q3, the programmable delay line delay is too short. Accordingly, the delay of the programmable delay line may be increased in order to produce a leading "1" at the position Q3 to match the leading "1" target.

In FIG. 10B, the values of the signals Q0-Q7 sampled during the calibration mode are also different from the target values of the signals Q0-Q7 indicating that the delay of the programmable delay line should be adjusted to more accurately estimate the delay of an integrated circuit path. In particular, since the leading "1" of the calibration mode output occurs at Q6 and the target leading "1" is occurs at Q3, the programmable delay line delay is too long. Accordingly, the delay of the programmable delay line may be decreased in order to produce a leading "1" at Q3 to match the leading "1" target.

Figure 11:
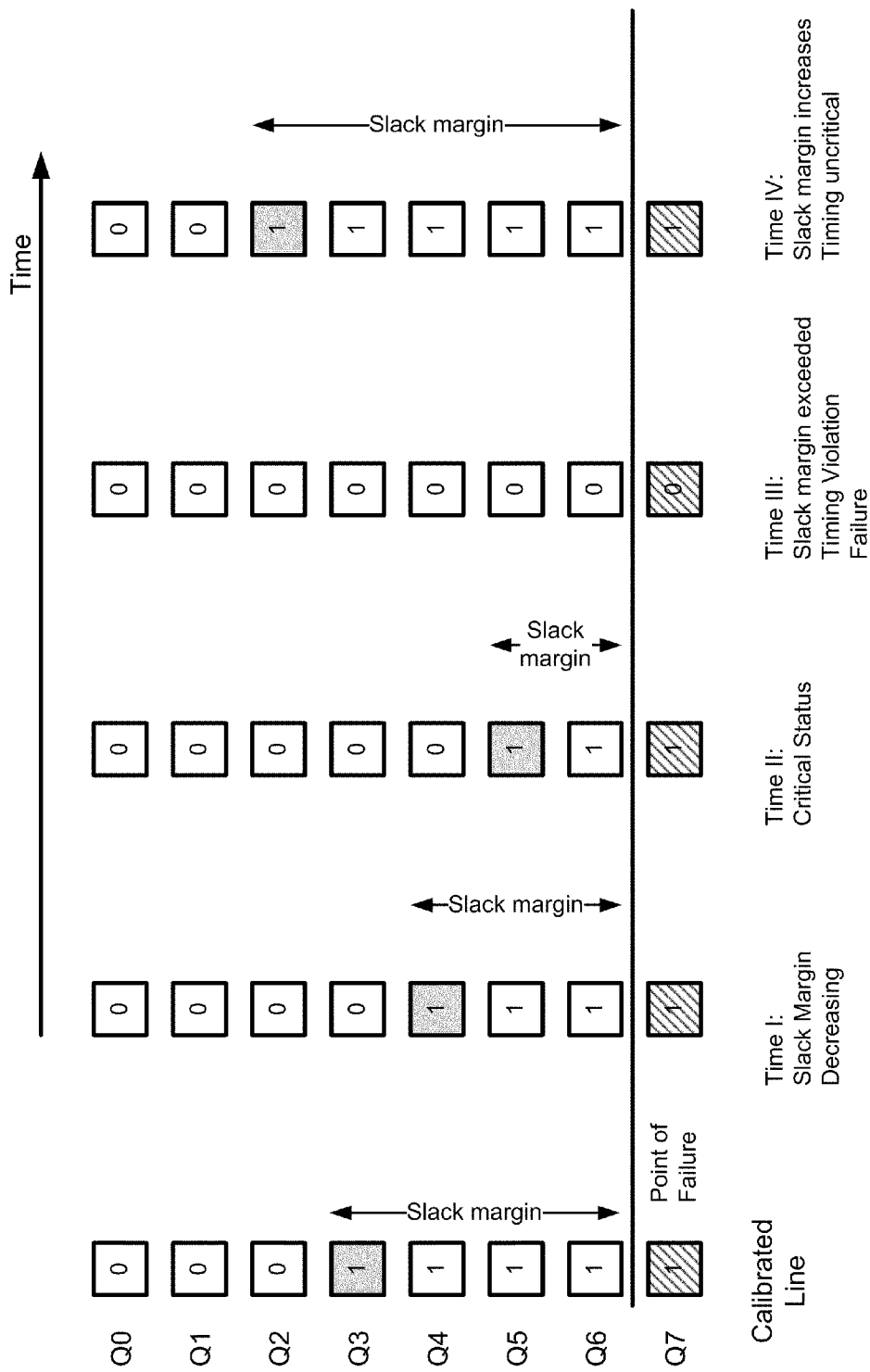
FIG. 11 illustrates the output signals of sampling flip-flops of a time-to-digital converter for a calibrated programmable delay line and at four different times during a measurement mode.

FIG. 11 illustrates the output signals of sampling flip-flops of delay monitoring circuitry for a calibrated programmable delay line and at four different times, Time I-Time IV, during a measurement mode. The programmable delay line of the delay monitoring circuitry may estimate a delay of one or more paths of an integrated circuit.

In the illustrative example of FIG. 11, the value of signal Q7 represents a state of a first sampling flip-flop to receive a 0-to-1 transition input signal after the input signal has propagated through the programmable delay line. The value of signal Q0 represents a state of a last sampling flip-flop to receive the 0-to-1 transition input signal after the input signal has propagated through the programmable delay line. A point of failure may be indicated by the output signal Q7. Thus, the delay of the programmable delay line associated with triggering the sampling flip-flop producing the signal Q7 represents the longest delay of an integrated circuit path that would not produce a timing violation. The "slack margin" indicates a difference between the last sampling flip-flop to receive a 0-to-1 transition input signal before the states of the sampling flip-flops are sampled and the point of failure.

The first column of FIG. 11 includes the values of output signals of sampling flip-flops of a time-to-digital converter of the delay monitoring circuitry when a programmable delay line of the delay monitoring circuitry has been calibrated. At Time I, the states of the sampling flip-flops are sampled and the values of the output signals of the sampling flip-flops are shown in the second column of FIG. 11. The values of the output signals Q0-Q7 indicate that the slack margin is decreasing at Time I. Thus, a delay of the integrated circuit path that is being monitored may be increasing.

At Time II, the states of the sampling flip-flops are sampled and the values of the output signals of the sampling flips are shown in the third column of FIG. 11. The values of the output signals Q0-Q7 at Time II indicate a further decrease in the slack margin. The slack margin shown in the third column of FIG. 11 may indicate that the status of the integrated circuit path being monitored is critical because of the continued increase in the delay of the integrated circuit path.

At Time III, the states of the sampling flip-flops are sampled and the values of the output signals of the sampling flip-flops are shown in the fourth column of FIG. 11. The values of the output signals Q0-Q7 at Time III show that the slack margin has been exceeded and that a timing violation has occurred or is imminent with respect to the integrated circuit path being monitored because the delay of the integrated circuit path is too long and has exceeded the clock period.

At time IV, the states of the sampling flip-flops are sampled and the values of the output signals of the sampling flip-flops are shown in the fifth column of FIG. 11. The values of the output signals Q0-Q7 at Time IV show that the slack margin has increased and that the integrated circuit path being monitored is not in a critical state. In some instances, the slack margin may have increased because the supply voltage provided to the integrated circuit path being monitored has been able to recover and the delay of the integrated circuit path has decreased.

Figure 12:
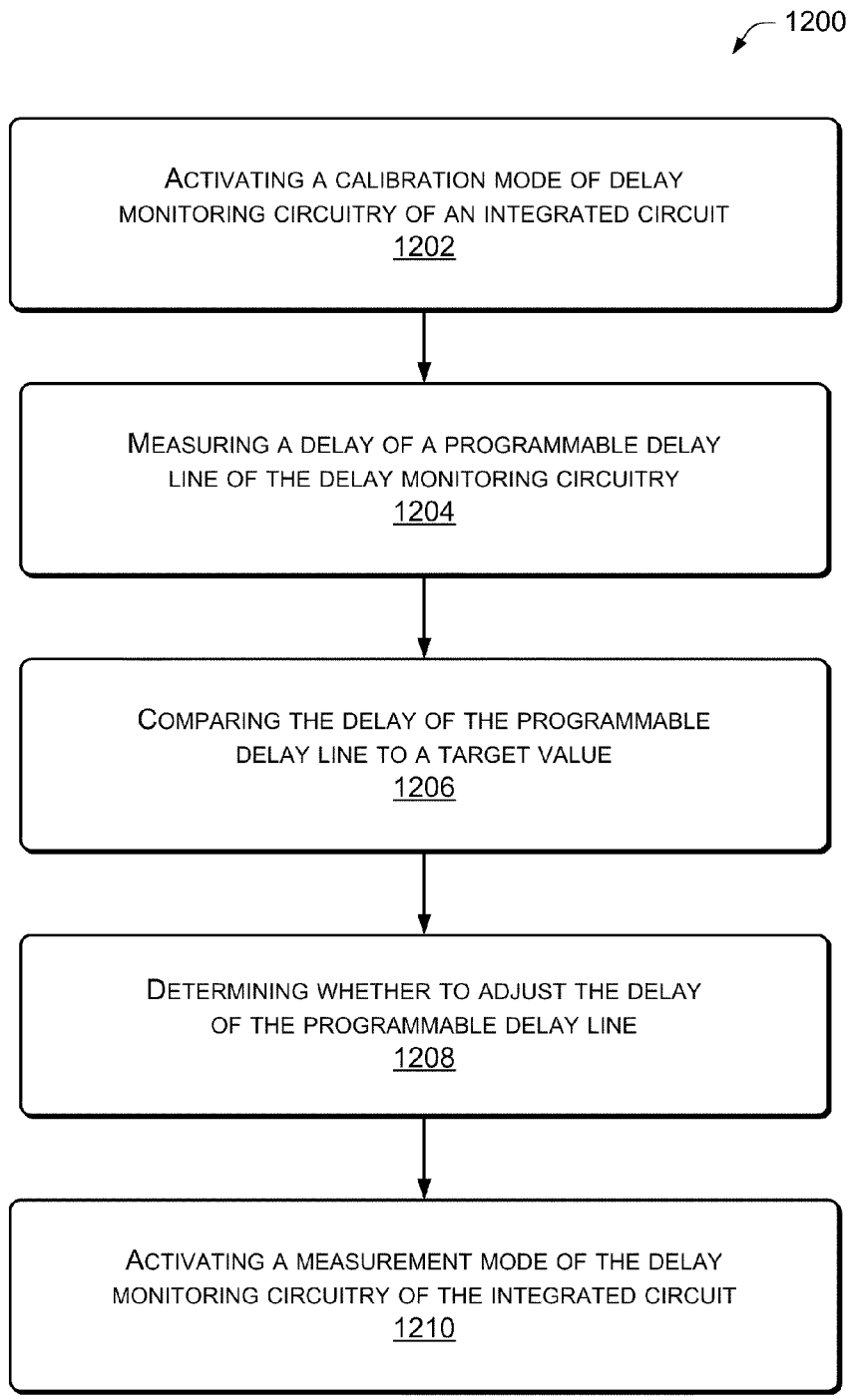
FIG. 12 is a flow diagram of a method of calibrating delay of delay monitoring circuitry.

FIG. 12 is a flow diagram of a method 1200 of calibrating delay of delay monitoring circuitry. Specifics of exemplary methods are described below. However, it should be understood that certain acts need not be performed in the order described, and may be modified, and/or may be omitted entirely, depending on the circumstances.

At 1202, the method 1200 includes activating a calibration mode of delay monitoring circuitry of an integrated circuit. The delay monitoring circuitry may estimate the delay associated with one or more paths of the integrated circuit to identify possible timing violations and trigger appropriate countermeasures. In particular, a programmable delay line of the delay monitoring circuitry may mimic the delay of the one or more paths of the integrated circuit.

The calibration mode may be activated due to changes in the clock frequency and/or supply voltage required by processes executed by the integrated circuit. For example, the integrated circuit may transition from executing processes of a first application requiring one set of clock frequency and supply voltage settings to executing processes of a second application requiring a different set of clock frequency and supply voltage settings. As the clock frequency and/or supply voltage requirements change, the delay associated with certain paths of the integrated circuit may also change. Therefore, the settings of the programmable delay line may need to be adjusted to more accurately estimate the delay associated with the integrated circuit path(s) being monitored.

At 1204, the method 1200 includes measuring a delay of the programmable delay line of the delay monitoring circuitry. The delay of the programmable delay line may be measured by a time-to-digital converter coupled to the programmable delay line. The time-to-digital converter may include a number of delay elements that are each coupled to a respective sampling flip-flop. In an illustrative example, the plurality of delay elements may be coupled in series, such as the delay elements 210-222 of FIG. 2, and be coupled to corresponding receiving flip-flops, such as the sampling flip-flops 224-238 of FIG. 2.

The time-to-digital converter may measure the delay of the programmable delay line based on the output signals of the sampling flip-flops. In an illustrative embodiment, a 0-to-1 transition input signal may be provided to the programmable delay line at a first rising or falling clock edge and the states of the sampling flip-flops may be sampled at a second rising or falling clock edge. The number of sampling flip-flops that change state before the second rising or falling clock edge indicates the delay of the programmable delay line. For example, when a larger number of the sampling flip-flops change state before the second rising or falling clock edge, the programmable delay line delay is shorter than when a smaller number of the sampling flip-flops change state before the second rising or falling clock edge.

At 1206, the method 1200 includes comparing the delay of the programmable delay line to a target value. The target value may represent a particular value for the delay of an integrated circuit path that is being mimicked by the programmable delay line.

At 1208, the method 1200 includes determining whether to adjust the delay of the programmable delay line. When the delay of the programmable delay line is different from the target value, then the delay of the programmable delay line may be adjusted. For example, when the delay of the programmable delay line is too long, an evaluation circuit of the delay monitoring circuitry may send a feedback signal to a configuration register that controls the delay of the programmable delay line specifying that the delay of the programmable delay line should be decreased. In addition, when the delay of the programmable delay line is too short, the feedback signal of the evaluation circuit may specify that the delay of the programmable delay line is to increase.

At 1210, the method 1200 includes activating a measurement mode of the delay monitoring circuitry of the integrated circuit. After the delay of the programmable delay line has been calibrated, a measurement mode of the delay monitoring circuitry may be activated. During the measurement mode, the delay of the programmable delay line may be measured to provide a real-time estimate of the delay of a path of the integrated circuit. Thus, the delay of the programmable delay line may be used to determine whether the delay of the integrated circuit path is approaching a critical value. For example, when the delay of the programmable delay line reaches a particular value that is equal to or greater than a threshold value, the delay of the integrated circuit path may be causing a timing violation or a timing violation may be imminent. When the delay of the programmable delay line indicates that the delay of the integrated circuit path is approaching a critical value, a signal may be provided by the delay monitoring circuitry to initiate a countermeasure to avoid or correct a timing violation.

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. A circuit arrangement comprising:
   a launching flip-flop configured to output a state transition from a first state to a second, different state based upon a state transition at an input thereof;
   a programmable delay line coupled to the launching flip-flop, the programmable delay line comprising a configuration unit, wherein the programmable delay line is configured to propagate the state transition from the launching flip-flop therethrough, and wherein a time to propagate the state transition therethrough is associated with a delay time of the programmable delay line;
   a time-to-digital converter coupled to the programmable delay line, the time-to-digital converter comprising at least one delay element coupled to a respective sampling flip-flop, wherein the time-to-digital converter is configured to measure the delay time of the programmable delay line; and
   a feedback loop circuit coupled to the time-to-digital converter and to the configuration unit, wherein the feedback loop circuit is adapted to compare the measured delay time to a predetermined target value and provide at least one input signal to the configuration unit based on a result of the comparison.

2. The circuit arrangement of claim 1, wherein the feedback loop circuit comprises an evaluation circuit to receive the at least one output signal from the time-to-digital converter and to provide the at least one input signal to the configuration unit.

3. The circuit arrangement of claim 1, wherein the feedback loop circuit is adapted to provide the at least one input signal to the configuration unit during a calibration mode.

4. The circuit arrangement of claim 1, wherein the configuration unit comprises an arithmetic logic unit and a configuration register, the arithmetic logic unit coupled to the feedback loop and coupled to the configuration register, the configuration register is adapted to store at least one configuration setting of the programmable delay line, and the arithmetic logic unit is adapted to provide at least one signal to the configuration register to change the at least one configuration setting of the programmable delay line based on the at least one input signal received from the feedback loop.

5. The circuit arrangement of claim 1, wherein the feedback loop, the configuration unit, and the programmable delay line are configured to provide a digital-to-time converter.

6. The circuit arrangement of claim 1, wherein the feedback loop circuit is not adapted to provide the at least one input signal to the configuration unit during a measurement mode.

7. The circuit arrangement of claim 1, wherein the launching flip-flop, the programmable delay line, the time to digital converter, and the feedback loop circuit are integrated on the same integrated circuit, and wherein a calibration mode is activated when processes executed by the integrated circuit change from a first type of process to a second type of process, when the integrated circuit is configured to execute processes of more than one type, or a combination thereof.

8. The circuit arrangement of claim 7, wherein the integrated circuit is configured to execute the first type of process and the second type of process utilizing a different supply voltage, a different clock frequency, or a combination thereof.

9. The circuit arrangement of claim 1, wherein the feedback loop circuit is further configured to compare the measured delay time to a predetermined threshold value that is different from the predetermined target value in a measurement mode, and provide an output signal indicating a possible timing violation if the measured delay time exceeds the predetermined threshold value.

10. The circuit arrangement of claim 9, wherein the feedback loop circuit is further configured to provide a different output signal indicating a slack margin if the measured delay time is less than the predetermined threshold value, wherein the slack margin reflects a magnitude of a difference between the measured delay time and the predetermined threshold value.

* * * * *